US011209875B2

(12) United States Patent
Jang

(10) Patent No.: US 11,209,875 B2
(45) Date of Patent: Dec. 28, 2021

(54) ADHESIVE MEMBER AND DISPLAY DEVICE INCLUDING THE SAME

(71) Applicant: Samsung Display Co., LTD., Yongin-si (KR)

(72) Inventor: Joo-Nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/923,032

(22) Filed: Jul. 7, 2020

(65) Prior Publication Data

US 2021/0041922 A1 Feb. 11, 2021

(30) Foreign Application Priority Data

Aug. 9, 2019 (KR) .......................... 10-2019-0097331

(51) Int. Cl.
*H01L 51/52* (2006.01)
*G06F 1/18* (2006.01)
*H01L 51/56* (2006.01)
*H01L 27/32* (2006.01)
*G06F 1/16* (2006.01)

(52) U.S. Cl.
CPC .............. *G06F 1/181* (2013.01); *G06F 1/189* (2013.01); *H01L 27/3251* (2013.01); *H01L 27/3276* (2013.01); *H01L 51/5246* (2013.01); *H01L 51/5275* (2013.01); *H01L 51/56* (2013.01); *G06F 1/1637* (2013.01)

(58) Field of Classification Search
CPC . G06F 1/189; H01L 27/3253; H01L 27/3276; H01L 51/5246

USPC .......................................................... 349/38
See application file for complete search history.

(56) References Cited

U.S. PATENT DOCUMENTS 6,086,441 A * 7/2000 Akiguchi .................. H01J 9/28
 349/152
6,466,294 B1 * 10/2002 Yamagishi ............ G02F 1/1345
 349/155
9,019,714 B2 * 4/2015 Sato .......................... H05K 1/11
 361/760

(Continued)

FOREIGN PATENT DOCUMENTS

JP 11148058 A * 6/1999
KR 10-2015-0055857 5/2015

(Continued)

*Primary Examiner* — Christopher M Raabe
(74) *Attorney, Agent, or Firm* — H.C. Park & Associates, PLC

(57) ABSTRACT

According to one aspect of the invention, a display device includes: a first layer having a display area and a non-display area adjacent thereto, the first layer including first and second pads overlapping the non-display area and spaced apart from each other in a first direction; a second layer including third and fourth pads that respectively face the first and second pads in a thickness direction of the first layer; and an adhesive layer disposed between the first and second layers and including and a plurality of conductive groups spaced apart from each other in the first direction and distributed along a second direction generally perpendicular to the first direction, wherein the conductive groups comprise conductive particles arranged in the second direction, and the adhesive layer has a thickness greater than about 0.5 times to about 2.0 times a diameter of the conductive particles.

20 Claims, 16 Drawing Sheets

(56) References Cited

U.S. PATENT DOCUMENTS

| | | | |
|---|---|---|---|
| 9,063,385 B2 * | 6/2015 | Hsueh | G02F 1/1339 |
| 9,515,057 B2 | 12/2016 | Ma et al. | |
| 9,768,415 B2 | 9/2017 | Son et al. | |
| 9,991,614 B2 | 6/2018 | Hayashi et al. | |
| 10,388,624 B2 | 8/2019 | Hayashi et al. | |
| 2006/0170342 A1 * | 8/2006 | Kim | H01L 27/3276 |
| | | | 313/512 |
| 2009/0121349 A1 * | 5/2009 | Suzuki | G02F 1/13306 |
| | | | 257/737 |
| 2017/0309646 A1 * | 10/2017 | Son | G06F 1/1643 |
| 2017/0338198 A1 | 11/2017 | Jang et al. | |

FOREIGN PATENT DOCUMENTS

| | | |
|---|---|---|
| KR | 10-1929697 | 7/2017 |
| KR | 10-1776584 | 9/2017 |
| KR | 10-2017-0130003 | 11/2017 |
| KR | 10-2017-0135919 | 12/2017 |
| KR | 10-1936109 | 1/2019 |
| KR | 10-1969248 | 4/2019 |

\* cited by examiner

ADHESIVE MEMBER AND DISPLAY DEVICE INCLUDING THE SAME

CROSS-REFERENCE TO RELATED APPLICATIONS

This application claims priority from and the benefit of Korean Patent Application No. 10-2019-0097331, filed on Aug. 9, 2019, which is hereby incorporated by reference for all purposes as if fully set forth herein.

BACKGROUND

Field

Exemplary implementations of the invention relate generally to a display device and, more specifically, to an adhesive member and a display device including the same.

Discussion of the Background

Various display devices used in multimedia equipment such as televisions, mobile phones, table computers, navigation devices, and game consoles are being developed. Such a display device includes a display panel on which an image is displayed. The display panel includes a plurality of gate lines, a plurality of data lines, and a plurality of pixels connected to the plurality of gate lines and the plurality of data lines. The display panel may be connected to an electronic component that provides an electrical signal required for displaying an image to the gate lines or the data lines. The electronic component may be mounted on the display panel by using an anisotropic conductive film or an ultrasonography method.

The above information disclosed in this Background section is only for understanding of the background of the inventive concepts, and, therefore, it may contain information that does not constitute prior art.

SUMMARY

Applicant discovered that the thickness of an adhesive layer electrically connecting components in display devices may compromise the reliability of the connections and cause undesirable short circuits.

Display devices including adhesive members constructed according to the principles and exemplary implementations of the invention improve connective reliability between electrical components in a display device, such as between an electronic component and a display panel.

For example, according to exemplary implementation of the invention, the thickness of the adhesion layer may be formed based on the diameter of the conductive particle. As a result, even though the pressure is applied to the adhesion layer from the outside while the two conductive pads are bonded to each other, the flow of the conductive particles distributed in the adhesion layer may be prevented, which minimizes short-circuiting of adjacent pads. Therefore, the overall driving reliability of the display device may be improved.

Additional features of the inventive concepts will be set forth in the description which follows, and in part will be apparent from the description, or may be learned by practice of the inventive concepts.

According to one aspect of the invention, a display device includes: a first layer having a display area and a non-display area adjacent thereto, the first layer including first and second pads overlapping the non-display area and spaced apart from each other in a first direction; a second layer including third and fourth pads that respectively face the first and second pads in a thickness direction of the first layer; and an adhesive layer disposed between the first and second layers and including and a plurality of conductive groups spaced apart from each other in the first direction and distributed along a second direction generally perpendicular to the first direction, wherein the conductive groups comprise conductive particles arranged in the second direction, and the adhesive layer has a thickness greater than about 0.5 times to about 2.0 times a diameter of the conductive particles.

The conductive groups may be arranged at a predetermined interval in the first direction.

The conductive groups may include three sub groups, and the first and second pads may include, respectively, first and second signal pads and the third and fourth pads may include, respectively, first and second driving pads; and the first sub group may be disposed between the first signal pad and the first driving pad to electrically connect the first signal pad to the first driving pad, the second sub group may be disposed between the second signal pad and the second driving pad to electrically connect the second signal pad to the second driving pad, and the third sub group may be disposed between the first sub group and the second sub group without overlapping either of the first signal pad and the second signal pad.

Each of the first sub group, the second sub group, and third sub group may include at least one conductive group of the conductive groups.

Each of the first sub group, the second sub group, and third sub group may include corresponding conductive groups of the conductive groups, wherein the number of conductive groups of each of the first sub group and the second sub group may be greater than that of conductive groups of the third sub group.

Each of the first sub group and the second sub group may include corresponding conductive groups and the third sub group may include two conductive groups, a first distance between the first driving pad and a first conductive group that is closest to the first driving pad may be greater than a second distance between the second driving pad and a second conductive group that is closest to the second driving pad in a plan view, and a distance between the first conductive group and the second conductive group that is closest to the first conductive group among the conductive groups of the third sub group may be greater than each of the first distance and the second distance.

The first layer may include a display substrate, the second layer may include an electronic component, the first and second pads may include, respectively, first and second signal pads, and the third and fourth pads may include, respectively, first and second driving pads, and the conductive groups may include a first sub group disposed between the first signal pad and the first driving pad and a second sub group disposed between the second signal pad and the second driving pad, and the first sub group and the second sub group may be alternately and repeatedly arranged in the first direction.

The conductive groups may be arranged at a predetermined interval in the first direction, and each of a first distance between the first driving pad and a conductive group that is closest to the first sub group among the conductive groups of the second sub group and a distance between the second driving pad and a conductive group that is closest to the second sub group among the conductive groups of the first sub group may be greater than the predetermined interval in a plan view, wherein the predetermined interval satisfies following equation:

$$Dk = \frac{Vd}{DSr}$$

where Dk is a spaced distance, Vd is a voltage level applied to each of the conductive particles, and DSr is an insulation strength of the adhesive layer.

The second layer may include an electronic component, and the electronic component may further include a base substrate on which the first driving pad and the second driving pad may be disposed, the adhesive layer may include a first adhesive portion overlapping the first driving pad and the second driving pad and a second adhesive portion that may not overlap the first driving pad and the second driving pad, and further including an inner space defined between the second adhesive portion and the base substrate.

The second adhesive portion may partially fill the inner space.

The adhesive layer may have a refractive index greater than that of air within the inner space.

The adhesive layer may include a photo initiator activated by external ultraviolet rays.

A filler may have a first filling portion that may not overlap the electronic component and a second filling portion disposed in the inner space.

The filler may include a photo initiator activated by external ultraviolet rays.

The first filling portion may have a planar area greater than that of the second filling portion.

The adhesive layer may have a thermal initiator activated by a temperature change.

A spaced distance between two adjacent conductive groups of the conductive groups may satisfy following equation:

$$Dk = \frac{Vd}{DSr}$$

where Dk is a spaced distance, Vd is a voltage level applied to each of the conductive particles, and DSr is an insulation strength of the adhesive layer.

According to another aspect of the invention, an adhesive member for connecting electronic components in a display device includes: an adhesive layer; and conductive groups distributed on the adhesive layer at a predetermined interval in a first direction and extending in a second direction generally perpendicular to the first direction, wherein the conductive groups include conductive particles arranged in the second direction, and the adhesive layer has a thickness greater than about 0.5 times to about 2.0 times a diameter of the conductive particles. At least some of the conductive particles may be partially exposed by the adhesive layer.

At least some of the conductive particles arranged in the second direction may be electrically connected to each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
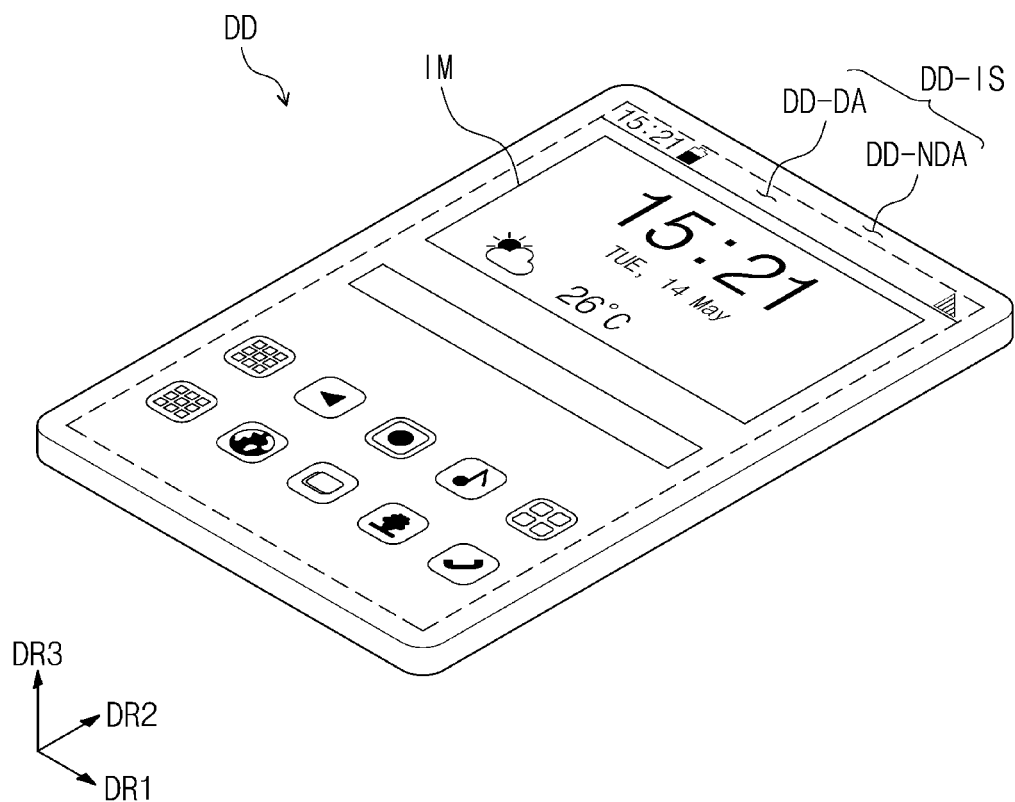
FIG. 1A is a perspective view of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
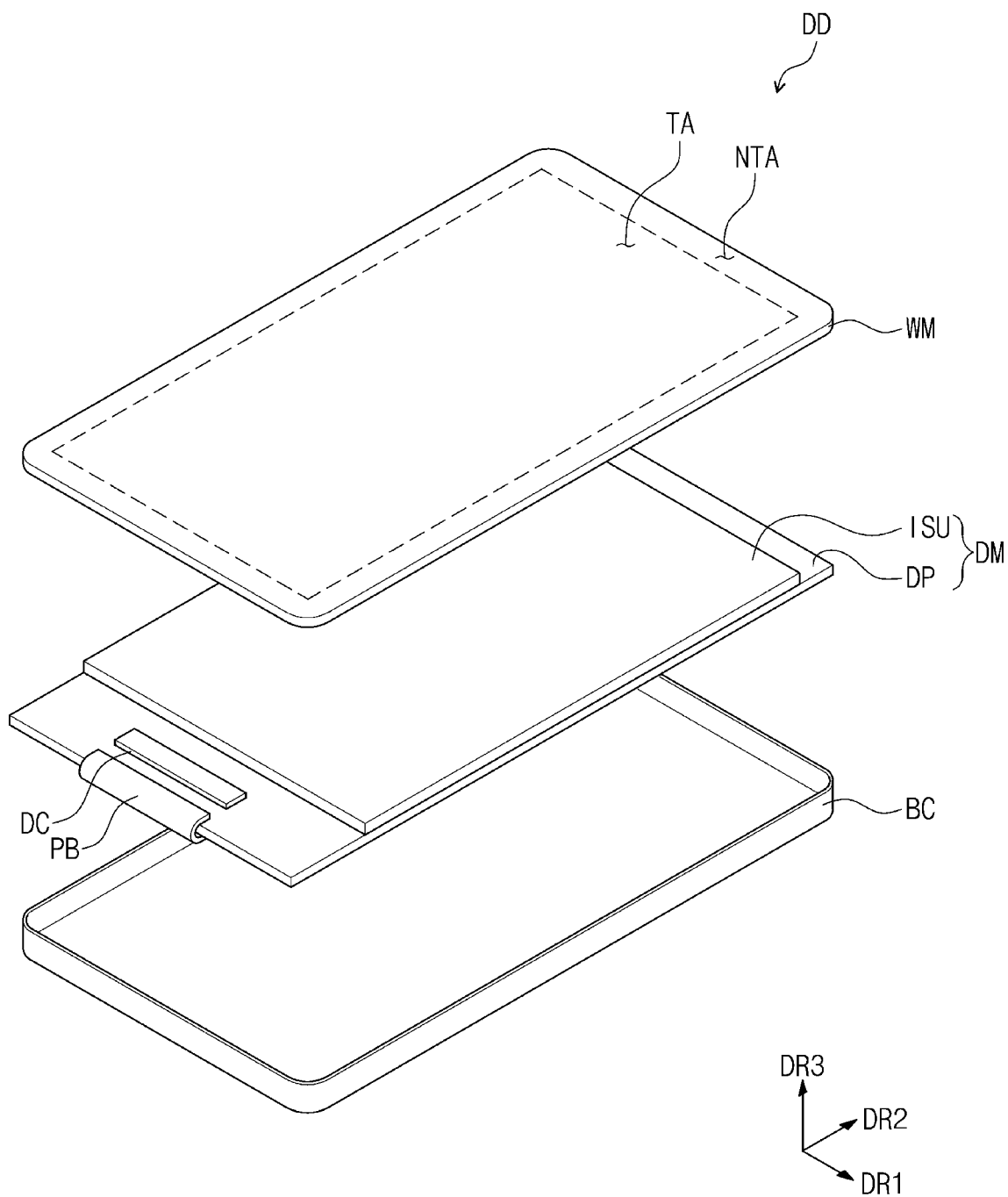
FIG. 1B is an exploded perspective view of the display device of FIG. 1A.
Figure 2:
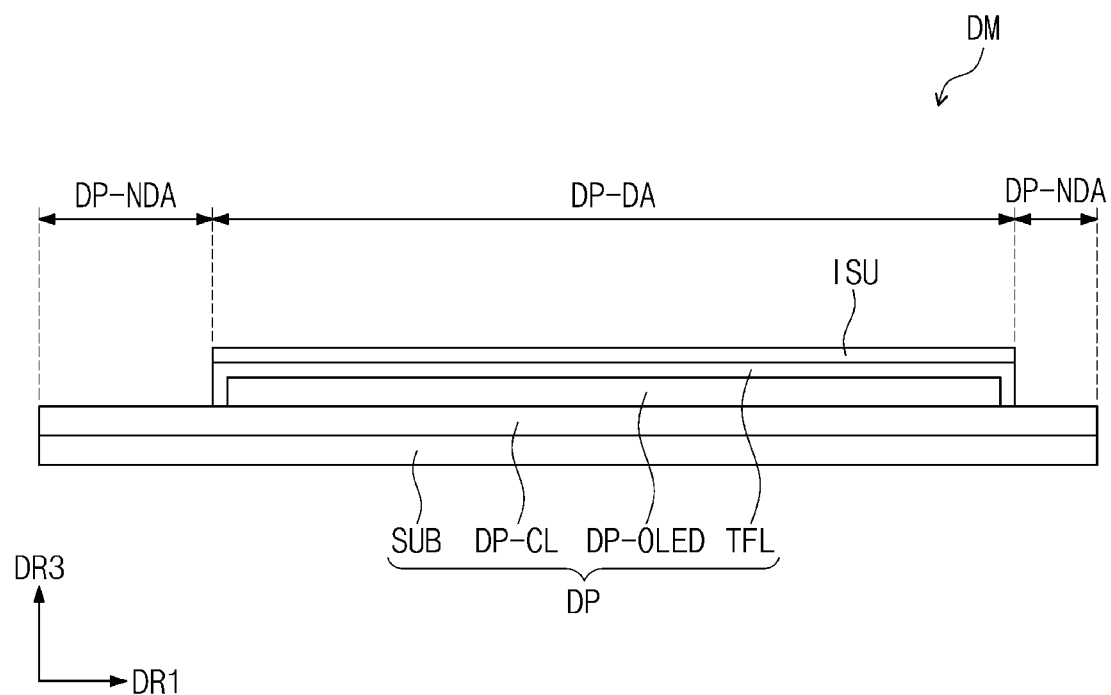
FIG. 2 is a cross-sectional view of the display module shown in FIG. 1A.

FIG. 1A is a perspective view of an exemplary embodiment of a display device constructed according to principles of the invention. FIG. 1B is an exploded perspective view of the display device of FIG. 1A. FIG. 2 is a cross-sectional view of the display module shown in FIG. 1A.

In this specification, a display device DD that is capable of being applied to a mobile terminal is exemplarily illustrated. Electronic modules, a camera module, a power module, and the like, which are mounted on a main board, may be disposed on a bracket/case together with the display device DD to constitute the mobile terminal. The display apparatus DD according to exemplary embodiments may be applied to the large-sized electronic apparatuses such as televisions and monitors and small and middle-sized electronic apparatuses such as tablet PC, navigation units for vehicles, game consoles, and smart watches.

Referring to FIG. 1A, the display device DD may display an image IM through a display surface DD-IS. Icon images as an example of the image IM are illustrated in FIG. 1A. The display surface DD-IS is generally parallel to a surface defined by a first direction DR1 and a second direction DR2. A normal direction of the display surface DD-IS, i.e., a thickness direction of the display device DD is indicated as a third direction DR3. In this specification, "when viewed in a plan view or in the plan view" means a case when viewed in the third direction DR3. A front surface (or a top surface) and a rear surface (or a bottom surface) of each of layers or units, which will be described below, are distinguished by the third direction DR3. However, directions indicated as the first to third directions DR1, DR2, and DR3 may be changed into different directions, for example, opposite directions as a relative concept.

Also, the display surface DD-IS includes a display area DD-DA on which an image IM is displayed and a non-display area DD-NDA that is adjacent to the display area DD-DA. The non-display area DD-NDA may be an area on which an image is not displayed. However, exemplary embodiments are not limited thereto. The non-display area DD-NDA may be adjacent to one side of the display area DD-DA or be omitted.

Referring to FIG. 1B, the display device DD may include a window WM, a display module DM, a driving chip DC, a circuit board PB, and an accommodating member or back cover BC. The back cover BC may have sufficient space therein to accommodate or contain the display module DM and be coupled to the window WM. The window WM may be disposed above the display module DM to transmit an image provided from the display module DM to the outside. The window WM includes a transmission area TA and a non-transmission area NTA. The transmission area TA may have a shape that overlaps the display area DD-DA to correspond to the display area DD-DA. The image IM displayed on the display area DD-DA of the display device DD may be visible through the transmission area of the window WM from the outside.

The non-transmission area NTA may have a shape that overlaps the non-display area DD-NDA to correspond to the non-display area DD-NDA. The non-transmission area NTA may be an area having a light transmittance that is relatively less than that of the transmission area TA. However, exemplary embodiments are not limited thereto, and the non-transmission area NTA may be omitted.

The window WM may be made of glass, sapphire, or plastic. Also, although the window WM is provided as a single layer, the window WM may include a plurality of layers. The window WM may include a base layer and at least one printed layer overlapping the non-transmission area NTA and disposed on a rear surface of the base layer. The printed layer may have a predetermined color. For example, the printed layer may have a black color or have other colors except for the black color.

The display module DM is disposed between the window WM and the bracket BC. The display module DM includes a display panel DP and an input sensing layer ISU. The display panel DP generates an image to transmit the generated image to the window WM.

According to an exemplary embodiment, the display panel DP may be an emission type display panel, but is not limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

Hereinafter, a case in which the display panel according to an exemplary embodiment is an organic light emitting display panel will be described. However, the exemplary embodiments are not limited thereto, and the inventive concepts may be applied to various types of display panels.

Referring to FIG. 2, the display panel DP includes a substrate SUB, a circuit element layer DP-CL disposed on the substrate SUB, a display element layer DP-OLED, and an insulation layer TFL.

The display panel DP includes a display area DP-DA and a non-display area DP-NDA. The display area DP-DA of the display panel DP may correspond to the display area DD-DA of FIG. 1A or the transmission area TA of FIG. 1B, and the non-display area DP-NDA may correspond to the non-display area DD-NDA of FIG. 1A or the non-transmission area NTA of FIG. 1B.

The substrate SUB may include at least one plastic film. The substrate SUB may include a plastic substrate, a glass substrate, a metal substrate, or an organic/inorganic composite substrate as a flexible substrate.

The circuit element layer DP-CL includes at least one intermediate insulation layer and a circuit element. The intermediate insulation layer includes at least one intermediate inorganic film and at least one intermediate organic film. The circuit element includes signal lines, a driving circuit of a pixel, and the like.

The display element layer DP-OLED may include a plurality of organic light emitting diodes. The display element layer DP-OLED may further include an organic layer such as a pixel defining layer. According to another exemplary embodiment, when the display panel is provided as a liquid crystal display panel, the display element layer may be provided as a liquid crystal layer.

The insulation layer TFL seals the display element layer DP-OLED. For example, the insulation layer TFL may be a thin film encapsulation layer. The insulation layer TFL protects the display element layer DP-OLED against foreign substances such as moisture, oxygen, and dust particles. However, exemplary embodiments are not limited thereto. For example, an encapsulation substrate may be provided instead of the insulation layer TFL. In this case, the encapsulation substrate may be opposite to the substrate SUB, and the circuit element layer DP-CL and the display element layer DP-OLED may be disposed between the encapsulation substrate and the substrate SUB.

The input sensing layer ISU may be disposed between the window WM and the display panel DP. The input sensing layer ISU senses an input applied from the outside. The input applied from the outside may be provided in various manners. For example, the external input includes various types of external inputs such as a portion of user's body, a stylus pen, light, heat, a pressure, or the like. Also, an input through contact with the portion of the human body such as user's hands as well as adjacent or neighboring space touches (for example, hovering) may also be one form of the input.

The input sensing layer ISU may be directly disposed on the display panel DP. In this specification, that "a constituent A is directly disposed on a constituent B" may mean that an adhesive member is not disposed between the constituents A and B. In the illustrated exemplary embodiment, the input sensing layer ISU may be manufactured together with the display panel DP through a continuous process. However, exemplary embodiments are not limited thereto. For example, the input sensing layer ISU may be provided as an individual panel and then be coupled to the display panel DP through an adhesive layer. For another example, the input sensing layer ISU may be omitted.

Referring to FIG. 1B again, the driving chip DC may overlap the non-display area DP-NDA and be disposed on the display panel DP. For example, the driving chip DC may generate a driving signal that is required for the operation of the display panel DP on the basis of the control signal transmitted from the circuit board PB. The driving chip DC may transmit the generated driving signal to the circuit element layer DP-CL of the display panel DP.

The circuit board PB is electrically connected to the display module DM. Although the circuit board PB is connected to the display panel DP as illustrated in FIG. 1B, exemplary embodiments are not limited thereto. For example, the circuit board PB may be electrically connected to the input sensing unit ISU.

In this specification, the circuit board PB and the driving chip DC are examples of electronic components. Particularly, each of the circuit board PB and the driving chip DC may be electrically connected to the display module DM through the adhesive member. The adhesive member according to the exemplary embodiments may be an anisotropic conductive film (ACF).

Figure 3:
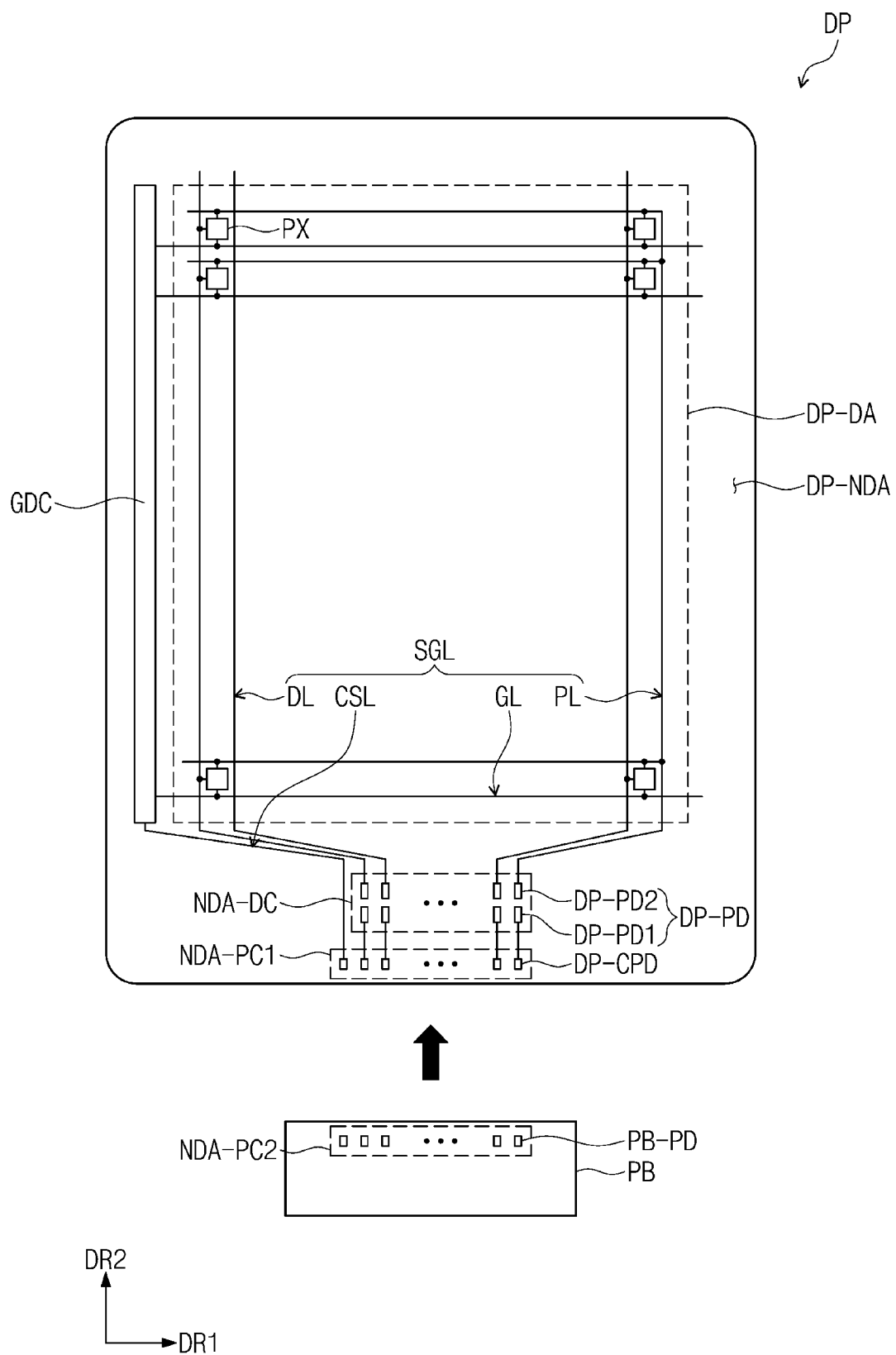
FIG. 3 is a schematic plan view of the display panel shown in FIG. 1A.
Figure 4A:
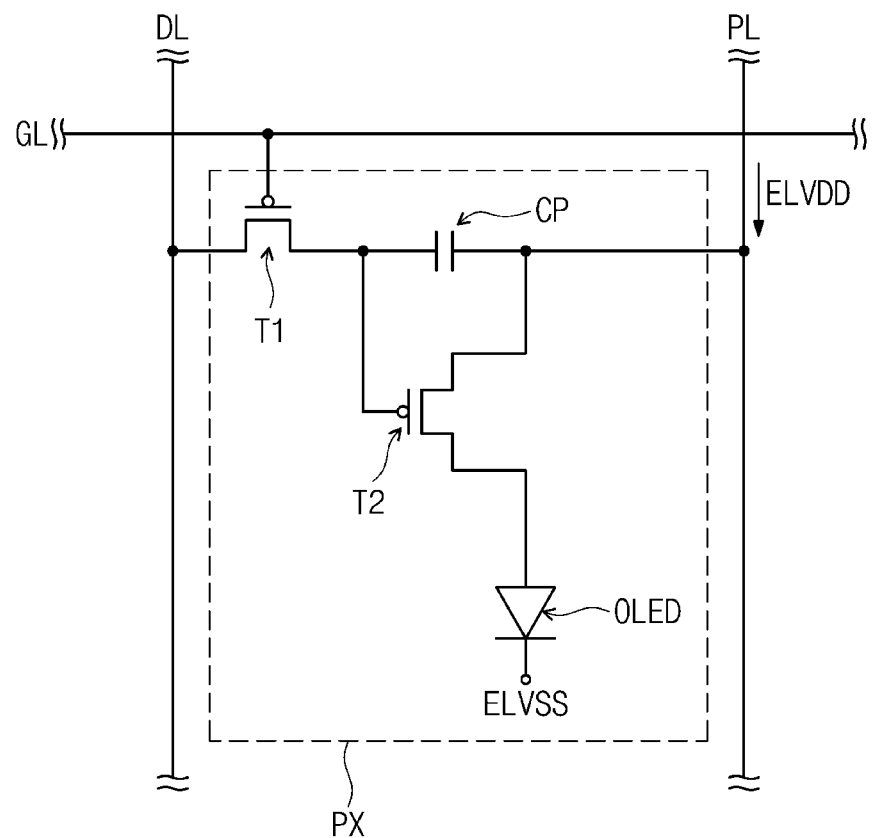
FIG. 4A is an equivalent circuit view illustrating an exemplary embodiment of a representative pixel of FIG. 3.
Figure 4B:
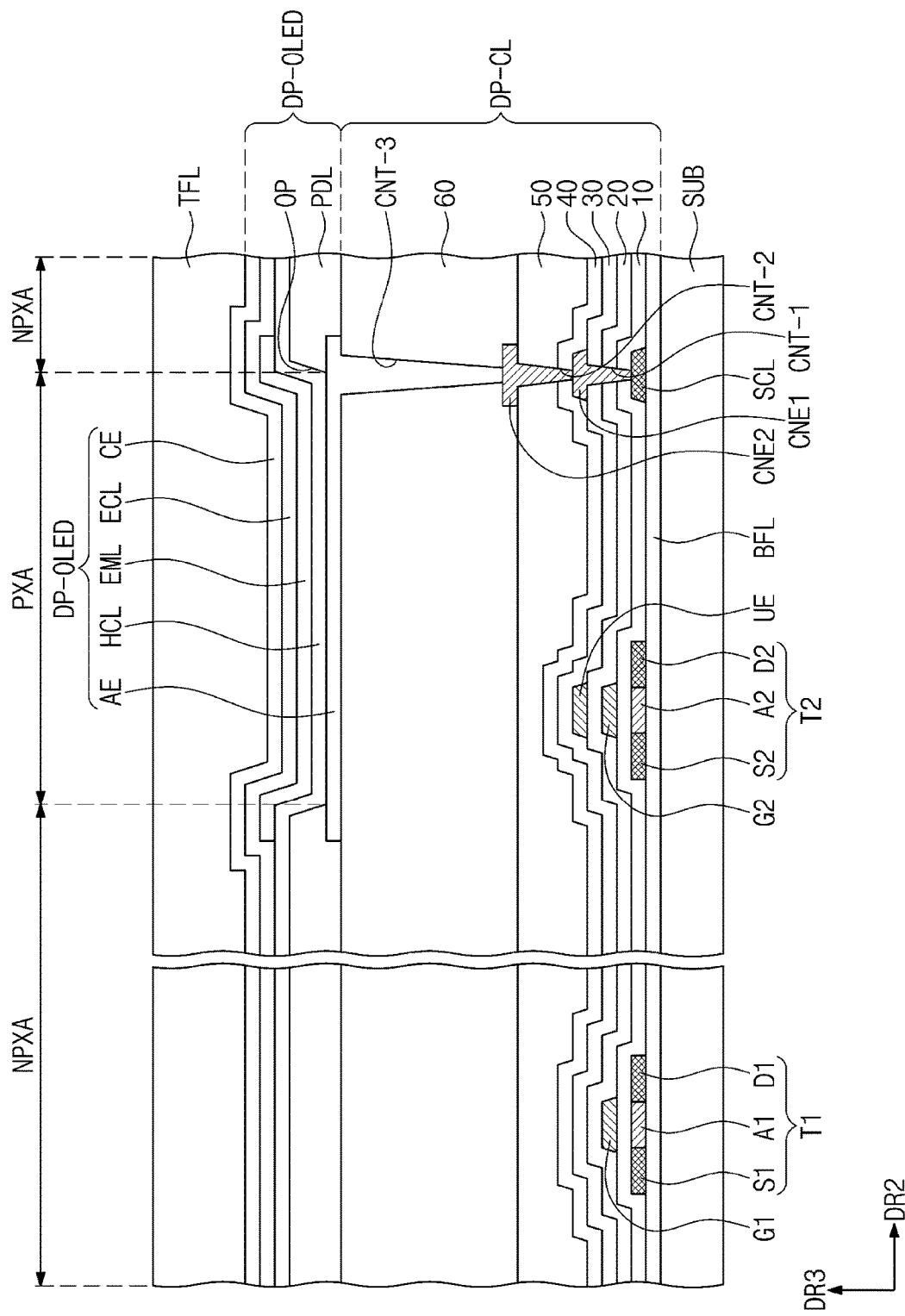
FIG. 4B is an enlarged, partial cross-sectional view of an exemplary embodiment of the display panel shown in FIG. 1A.

FIG. 3 is a schematic plan view of the display panel shown in FIG. 1A. FIG. 4A is an equivalent circuit view illustrating an exemplary embodiment of a representative pixel of FIG. 3. FIG. 4B is an enlarged, partial cross-sectional view of an exemplary embodiment of the display panel shown FIG. 1A Referring to FIG. 3, the display panel DP may include a driving circuit GDC, a plurality of signal lines SGL, a plurality of signal pads DP-PD, a plurality of connection signal pads DP-CPD, and a plurality of pixels PX (hereinafter, referred to as pixels). The pixels PX are disposed on the display area DP-DA. Each of the pixels PX includes an organic light emitting diode and a pixel driving circuit connected to the organic light emitting diode. The driving circuit GDC, the signal lines SGL, the signal pads DP-PD, the connection signal pads DP-CPD, and the pixel driving circuit may be provided in the circuit element layer DP-CL illustrated in FIG. 2.

In this specification, the display panel DP may be described as a display substrate. The display substrate may include the substrate SUB, the plurality of signal pads DP-PD disposed on the substrate SUB, and the plurality of connection signal pads DP-CPD.

The driving circuit GDC sequentially outputs gate signals to the plurality of gate lines GL. The driving circuit GDC may further output other control signals to the pixels PX. The driving circuit GDC may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL include gate lines GL, data lines DL, a power line PL, and a control signal line CSL. The gate lines GL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

The signal lines SGL overlap the display area DP-DA and the non-display area DP-NDA. Each of the signal lines SGL may include a pad part and a line part. The line part overlaps the display area DP-DA and the non-display area DP-NDA. The pad part is connected to an end of the line part. The pad part is disposed on the non-display area DP-NDA to overlap a corresponding signal pad of the signal pads DP-PD.

Hereinafter, in this specification, an area of the non-display area DP-NDA, on which the signal pads DP-PD are disposed, may be defined as a chip area NDA-DC, and an area of the non-display area DP-NDA, on which the connection signal pads DP-CPD are disposed, may be defined as a first pad area NDA-PC1.

According to an exemplary embodiment, the driving chip DC of FIG. 1B may be mounted on the chip area NDA-DC. The signal pads DP-PD are electrically connected to the driving chip DC to transmit the electrical signal received from the driving chip DC to the signal lines SGL.

In detail and hereinafter, the signal pads DP-PD includes first row signal pads DP-PD1 arranged in a first row along the first direction DR1 and second row signal pads DP-PD2 arranged in a second row along the first direction DR1. However, exemplary implementations are not limited thereto. For example, the signal pads DP-PD may be arranged in one row along the first direction DR1.

A portion of the circuit board PD may be disposed on the first pad area NDA-PC1. The connection signal pads DP-CPD are electrically connected to the circuit board PB to transmit the electrical signal received from the circuit board PB to the signal pads DP-PD. The circuit board PB may be rigid or flexible. For example, when the circuit board PB is flexible, the circuit board PCB may be provided as a flexible printed circuit board.

The circuit board PB may include a timing control circuit that controls operation of the display panel DP. The timing control circuit may be mounted in the form of an integrated chip on the circuit board PB. Also, the circuit board PB may include an input sensing circuit that controls the input sensing layer ISU.

The circuit board PB may include driving pads PB-PD electrically connected to the display panel DP. The driving pads PB-PD may be disposed on the second pad area NDA-PC2 defined on the circuit board PB.

According to an exemplary embodiment, the driving pads PB-PD are electrically bonded to the connection signal pads DP-CPD through the adhesive member AF (see FIG. 5) having conductivity. The adhesive member AF may be a conductive adhesive resin.

Referring to FIG. 4A, the display area DP-DA may be defined as an area on which the pixels PX are disposed. Each of the pixels PX includes an organic light emitting diode (OLED) and a pixel driving circuit connected to the organic light emitting diode (OLED).

In detail, the pixel PX may include a first transistor T1, a second transistor T2, a capacitor CP, and an organic light emitting diode OLED. It is sufficient if the pixel driving circuit includes a switching transistor and a driving transistor, but is not limited to the exemplary embodiment described with reference to FIG. 4A. As illustrated in FIG. 4A, although each of the first transistor T1 and the second transistor T2 is provided as a P-MOS transistor, exemplary embodiments are not limited thereto. For example, each of the first transistor T1 and the second transistor T2 may be provided as an N-MOS transistor.

The first transistor T1 is connected to the gate line GL and the data line DL. The organic light emitting diode OLED receives a first power voltage ELVDD and a second power voltage ELVSS, which are provided from the power line PL. The first power voltage ELVDD is provided to a first electrode AE of the organic light emitting diode OLED through the second transistor T2, and the second power voltage ELVSS is provided to a second electrode CE of the organic light emitting diode OLED. The second power voltage ELVSS may be less than the first power voltage ELVDD.

Referring to FIG. 4B, the display panel DP may include a plurality of insulation layers, a semiconductor pattern, a conductive pattern, a signal line, and the like. The insulation layer, the semiconductor layer, and the conductive layer may be formed through methods such as coating, deposition, and the like. Thereafter, the insulation layer, the semiconductor layer, and the conductive layer may be selectively patterned in a photolithography manner. The semiconductor pattern, the conductive pattern, and the signal line, which are provided in the circuit element layer DP-CL and the display element layer DP-OLED, may be formed in the above-described manner. In the display panel DP of FIG. 4B, the pixel driving circuit may further include elements when compared to the pixel driving circuit of FIG. 4A including the first transistor T1 and the second transistor T2. The substrate SUB may be a base substrate that supports the circuit element layer DP-CL and the display element layer DP-OLED.

The substrate SUB may include a synthetic resin film. The synthetic resin layer may include a thermosetting resin. The substrate SUB may have a multi-layered structure. For example, the substrate SUB may have a three-layered structure of a synthetic resin layer, an adhesive layer, and a synthetic resin layer. Particularly, the synthetic resin layer may be a polyimide resin layer, and the material thereof is not particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In addition, the synthetic resin layer may include a glass substrate, a metal substrate, or an organic/inorganic composite substrate.

At least one inorganic layer may be disposed on a top surface of the substrate SUB. The inorganic layer may include at least one of oxide, titanium oxide, silicon oxide, silicon oxide nitride, zirconium oxide, or hafnium oxide. The inorganic layer may be provided as a multilayer. The multi-layered inorganic layer may constitute a barrier layer and/or a buffer layer. In the illustrated exemplary embodiment, the display panel DP may include the buffer layer BFL.

The buffer layer BFL improves the bonding force between the substrate SUB and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. The semiconductor pattern may include polysilicon. However, exemplary embodiments are not limited thereto. For example, the semiconductor pattern may include amorphous silicon or metal oxide.

FIG. 4B illustrates merely a portion of the semiconductor pattern. For example, the semiconductor pattern may be further disposed on other areas of the pixel PX in the plan view. The semiconductor pattern may be arranged in a specific rule over the pixels PX. The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped.

The doped region may have conductivity greater than that of the non-doped region and substantially act as an electrode or a signal line. The non-doped region may substantially correspond to an active (or a channel) of the transistor. That is to say, a portion of the semiconductor pattern may be an active of the transistor, another portion may be a source or drain of the transistor, and further another portion may be a connection electrode or a connection signal line.

As illustrated in FIG. 4B, a source S1, an active A1, and a drain D1 of a first transistor T1 may be formed from the semiconductor pattern, and a source S2, an active A2, and a drain D2 of the second transistor T2 of the second transistor T2 may be formed from the semiconductor pattern. The sources S1 and S2 and the drains D1 and D2 extend from the actives A1 and A2 in directions opposite to each other. FIG. 4B illustrates a portion of the connection signal line SCL formed from the semiconductor pattern. The connection signal line SCL may be connected to the drain D2 of the second transistor T2 in the plan view.

A first insulation layer 10 is disposed on the buffer layer BFL. The first insulation layer 10 commonly overlaps the plurality of pixels PX and covers the semiconductor pattern. The first insulation layer 10 may include an inorganic layer and/or an organic layer and have a single-layered or multi-layered structure. The first insulation layer 10 may include at least one of oxide, titanium oxide, silicon oxide, silicon oxide nitride, zirconium oxide, or hafnium oxide. In the illustrated exemplary embodiment, the first insulation layer 10 may include a single-layered silicon oxide layer. The insulation layer of the circuit element layer DP-CL, which will be described below, as well as the first insulation layer 10 may be an inorganic layer and/or an organic layer and may have a single-layered or a multi-layered structure. The inorganic layer may include at least one of the above-described materials.

Gates G1 and G2 are disposed on the first insulation layer 10. Each of the gates G1 and G2 may be a portion of the metal pattern. The gates G1 and G2 overlap the actives A1 and A2. In the process of doping the semiconductor pattern, the gates G1 and G2 may serve as masks.

A second insulation layer 20 covering the gates G1 and G2 is disposed on the first insulation layer 10. The second insulation layer 20 commonly overlaps the pixels PX. The second insulation layer 20 may include an inorganic layer and/or an organic layer and have a single-layered or multi-layered structure. In the illustrated exemplary embodiment, the first insulation layer 20 may include a single-layered silicon oxide layer.

An upper electrode UE may be disposed on the second insulation layer 20. The upper electrode UE may overlap the gate G2 of the second transistor T2. The upper electrode UE may be a portion of the metal pattern. A portion of the gate G2 and the upper electrode UE overlapping the portion of the gate G2 may define a capacitor CP (see FIG. 4A).

A third insulation layer 30 covering the upper electrode UE is disposed on the second insulation layer 20. In the illustrated exemplary embodiment, the third insulation layer 30 may be a single-layered silicon oxide layer. The first connection electrode CNE1 may be disposed on the third insulation layer 30. The first connection electrode CNE1 may be connected to the signal line SCL through a contact hole CNT-1 passing through the first to third insulation layers 10 to 30.

A fourth insulation layer 40 covering the first connection electrode CNE1 is disposed on the third insulation layer 30. The fourth insulation layer 40 may be a single-layered silicon oxide layer. The fourth insulation layer 40 is disposed on a fifth insulation layer 50. The fifth insulation layer 50 may be an organic layer. A second connection electrode CNE2 may be disposed on the fifth insulation layer 50. The second connection electrode CNE2 may be connected to the first connection electrode CNE1 through a contact hole CNT-2 passing through the fourth insulation 40 and the fifth insulation layer 50.

A sixth insulation layer 60 covering the second connection electrode CNE2 is disposed on the fifth insulation layer 50. The sixth insulation layer 60 may be an inorganic layer. A first electrode AE is disposed on the sixth insulation layer 60. The first electrode AE is connected to the second connection electrode CNE2 through a contact hole CNT-3 passing through the sixth insulation layer 60. An opening OP is defined in the pixel defining layer PDL. The opening OP of the pixel defining layer PDL exposes at least a portion of the first electrode AE.

As illustrated in FIG. 4B, the display area DP-PA may include an emission area PXA and a light blocking area NPXA adjacent to the emission area PXA. The light blocking area NPXA may surround the emission area PXA. In the illustrated exemplary embodiment, the emission area PXA may be defined to correspond to a portion of an area of the first electrode AE exposed by the opening OP.

A hole control layer HCL may be commonly disposed on the emission area PXA and the light blocking area NPXA. The hole control layer HCL may include a hole transport layer and may further include a hole injection layer. The emission layer EML is disposed on the hole control layer HCL. The emission layer EML may be disposed on an area corresponding to the opening OP. That is, the emission layer EML may be formed to be separated from each of the pixels PX.

An electronic control layer ECL is disposed on the emission layer EML. The electron control layer ECL may include an electron transport layer and may further include an electron injection layer. The hole control layer HCL and the electron control layer ECL may be formed commonly formed on the plurality of pixels by using an open mask. A second electrode CE is disposed on the electronic control layer ECL. The second electrode CE is provided as a single body and commonly disposed on the plurality of pixels PX.

The encapsulation layer TFL is disposed on the second electrode CE. The encapsulation layer TFL may include a plurality of thin films.

Figure 5:
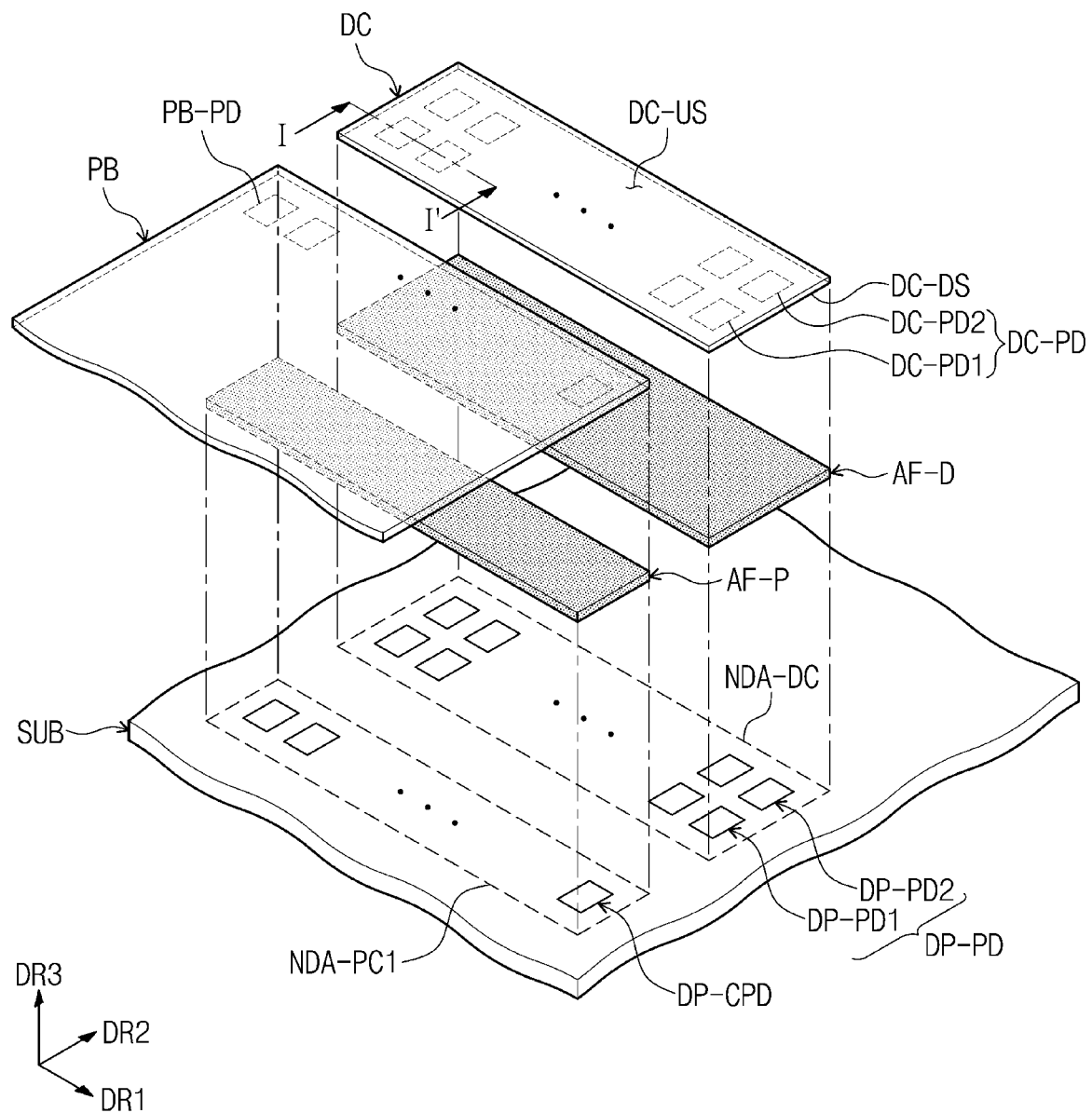
FIG. 5 is an exploded perspective view of an exemplary embodiment of the connection between the signal pads of the display panel and the driving pads of the circuit board by an adhesive member of the display device of FIG. 1A invention.

FIG. 5 is an exploded perspective view of an exemplary embodiment of the connection between the signal pads of the display panel and the driving pads of the circuit board by an adhesive member of the display of FIG. 1A.

Referring to FIG. 5, the display device DD further include adhesive members AF-D and AF-P. The adhesive members AF-D and AF-P include a first adhesive member AF-D and a second adhesive member AF-P. According to exemplary embodiments, each of the adhesive members AF-D and AF-P may be an anisotropic conductive film (ACF). The first adhesive member AF-D electrically bonds the driving chip DC to the display panel DP, and the second adhesive member AF-P electrically bonds the circuit board PB to the display panel DP.

In detail, the driving chip DC includes a top surface DC-US and a bottom surface DC-DS. The bottom surface DC-DS of the driving chip DC may be a surface that faces the display panel DP. The driving chip DC includes chip driving pads DC-PD, which are electrically connected to the signal pads DP-PD disposed on the substrate SUB described with reference to FIG. 3, respectively. The chip driving pads DC-PD includes first row signal pads DC-PD1 arranged in the first row along the first direction DR1 and second row signal pads DC-PD2 arranged in the second row along the first direction DR1. Each of the first row driving pads DC-PD1 and the second row driving pads DC-PD2 may have a shape that is exposed from a bottom surface of the driving chip DC to the outside.

The first adhesive member AF-D may be disposed between the driving chip DC and the substrate SUB of the display panel DP to electrically connect the driving chip DC to the display panel DP. A top surface of the first adhesive member AF-D may contact the chip driving pads DC-PD of the driving chip DC, and a bottom surface of the first adhesive member AF-D may contact the signal pads DP-PD.

The driving pads PB-PD provided in the circuit board PB are electrically connected to the connection signal pads DP-CPD, respectively. Each of the driving pads PB-PD may have a shape that is exposed from the bottom surface of the circuit board PB to the outside.

The second adhesive member AF-P may be disposed between the circuit board PB and the substrate SUB of the display panel DP to electrically connect the circuit board PB to the display panel DP. A top surface of the second adhesive member AF-P may contact the driving pads PB-PD of the circuit board PB, and a bottom surface of the second adhesive member AF-P may contact the connection signal pads DP-CPD.

Figure 6A:
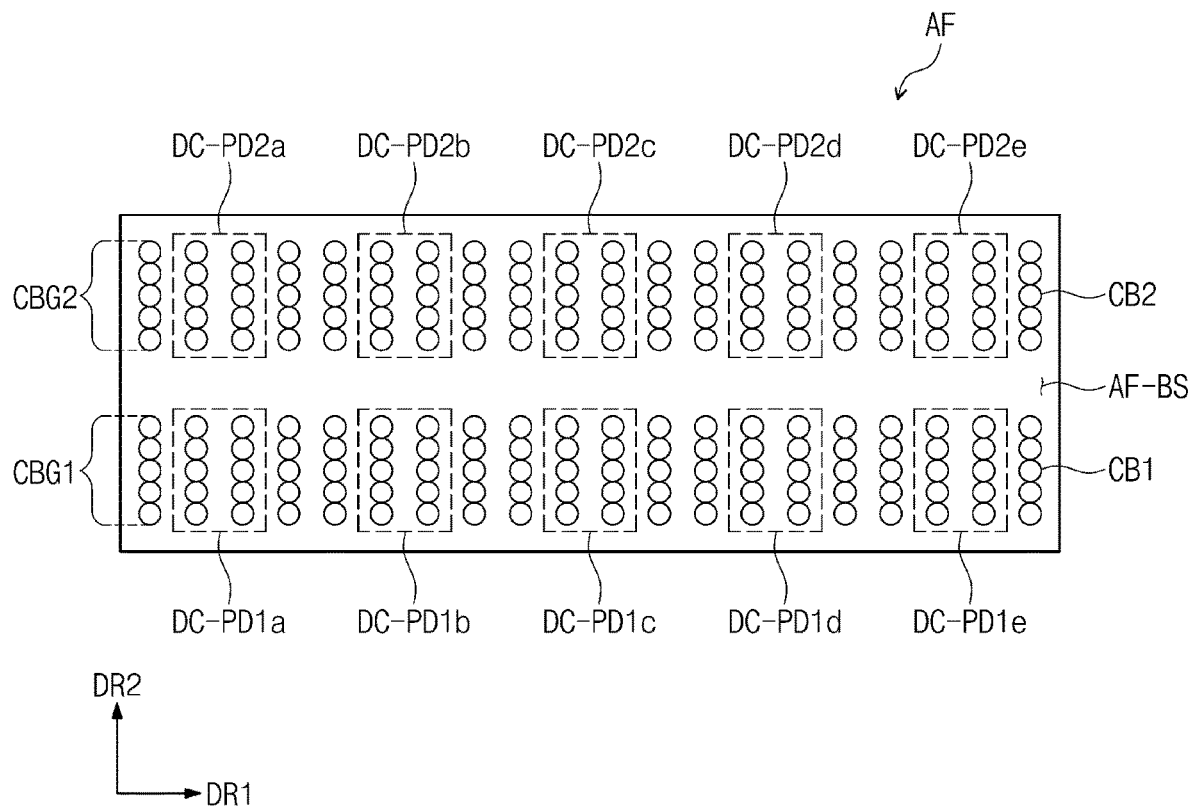
FIG. 6A is a schematic plan view of an exemplary embodiment of the adhesive member of FIG. 5.
Figure 6B:
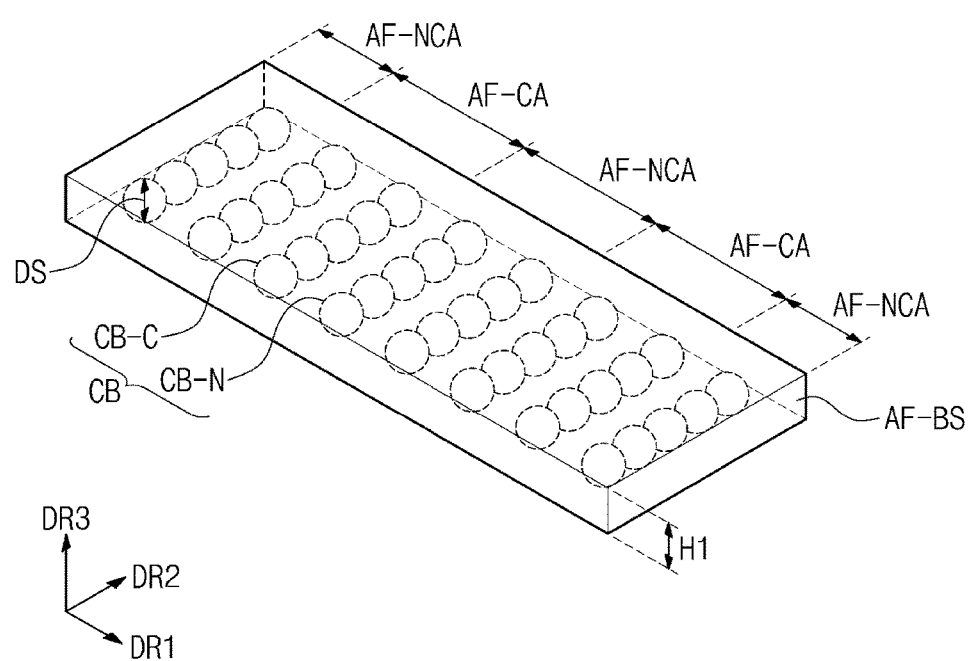
FIG. 6B is a schematic perspective view of the adhesive member of FIG. 5.
Figure 6C:
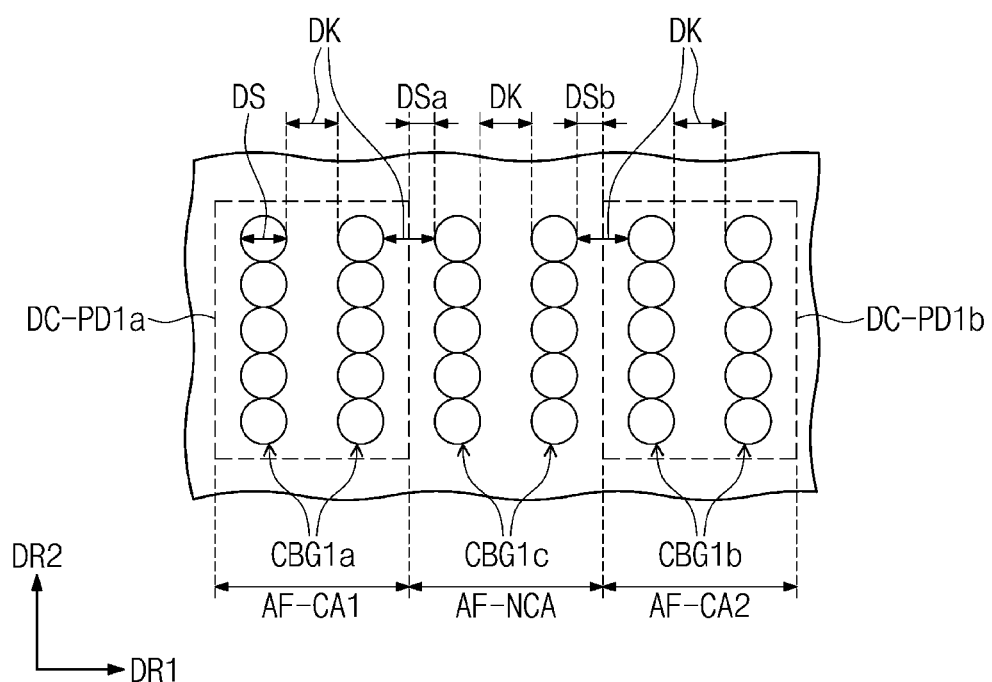
FIG. 6C is an enlarged, schematic plan view of an exemplary embodiment of a portion of the adhesive member of FIG. 6A.

FIG. 6A is a schematic plan view of an exemplary embodiment of the adhesive member of FIG. 5. FIG. 6B is a schematic perspective view of the adhesive member of FIG. 5. FIG. 6C is an enlarged, schematic plan view of an exemplary embodiment of a portion of the adhesive member of FIG. 6A.

According to an exemplary embodiment, each of the first adhesive member AF-D and the second adhesive member AF-P, which are illustrated in FIG. 5, may have the structure of the adhesive member AF that is described with reference to FIGS. 6A to 6C. For example, the structure of the adhesive member AF of FIG. 6A may correspond to the structure of the first adhesive member AF-D, and the structure of the adhesive member AF in which conductive particles CB2 arranged in the second row are omitted may correspond to the second adhesive member AF-P. Hereinafter, FIGS. 6A to 6C will be described based on the structure of the adhesive member AF corresponding to the first adhesive member AF-D.

Referring to FIG. 6A, the adhesive member AF includes an adhesive layer AF-BS and first and second conductive groups CBG1 and CBG2, which are respectively arranged in different rows. The adhesive layer AF-BS may be provided as an adhesive resin having a predetermined thickness. The first conductive groups CBG1 and the second conductive groups CBG2 may be distributed in predetermined patterns within the adhesive layer AF-BS along direction DR1.

The first conductive groups CBG1 may be spaced apart from each other in the first direction DR1 and extend in the second direction DR2. Each of the first conductive groups CBG1 may be defined as first conductive particles CB1 arranged in the second direction DR2. According to an exemplary embodiment, the first conductive groups CBG1 may have a shape arranged at a predetermined interval (pitch) in the first direction DR1. That is, the interval between any two adjacent first conductive groups may be the same in the first direction DR1.

Particularly, the first conductive groups CBG1 may be divided into a first connection group and a first non-connection group, which are alternately and repeatedly arranged in the first direction DR1. The first conductive groups provided in the first connection group among the first conductive groups CBG1 electrically connect the display panel DP to the electronic component. The first conductive groups provided in the first non-connection group among the first conductive groups CBG1 are electrically separated from the first conductive groups overlapping the first connection group.

Each of the first connection group and the first disconnection group may include at least one or more conductive groups. For example, FIG. 6A illustrates a structure in which each of the first and second disconnection groups includes two conductive groups. The first to fifth driving pads PC-PD1a, PC-PD1b, PC-PD1c, PC-PD1d, and PC-PD1e of the driving pads DC-PD1, which are arranged in the first row, of the driving chip DC may be electrically connected to the five first connection groups, which are arranged at a predetermined interval (pitch) in the first direction DR1.

The second conductive groups CBG2 may be spaced apart from each other in the first direction DR1 to extend in the second direction DR2. For example, each of the second conductive groups CBG2 may be defined as second conductive particles CB2 arranged in the second direction DR2. According to exemplary implementations of the invention, the second conductive groups CBG2 may be arranged at a predetermined interval in the first direction DR1. That is, the interval between the two adjacent second conductive groups may be the same in the first direction DR1.

Particularly, the second conductive groups CBG2 may be divided into a second connection group and a second non-connection group, which are alternately and repeatedly arranged in the first direction DR1. The second conductive groups provided in the second connection group among the second conductive groups CBG2 electrically connect the display panel DP to the electronic component. The second conductive groups provided in the second non-connection group among the second conductive groups CBG2 are electrically separated from the second conductive groups overlapping the second connection group.

Each of the second connection group and the second disconnection group may include at least one or more conductive groups. The first to fifth driving pads PC-PD2a, PC-PD2b, PC-PD2c, PC-PD2d, and PC-PD2e of the driving pads DC-PD2, which are arranged in the second row, may be electrically connected to the five second connection groups, which are arranged at a predetermined interval in the first direction DR1.

FIG. 6A illustrates a structure in which each of one first conductive group CBG1 and one second conductive group CBG2 includes five conductive particles. As described above, as one connection group includes two conductive groups, one connection group and one driving pad may be electrically connected to each other through ten conductive particles. However, the number of conductive particles provided in each of the first conductive group CBG1 and the second conductive group CBG2 is not limited thereto and thus may vary.

Also, although the conductive particles provided in each of the first conductive group CBG1 and one second conductive group CBG2 are illustrated as electrically contacting each other, exemplary embodiments are not limited thereto. For example, the conductive particles may be spaced apart from each other in the second direction DR2.

FIG. 6B illustrates some of the conductive groups of one of the first conductive groups CBG1 and the second conductive groups CBG2 illustrated in FIG. 6A. As described above with reference to FIG. 6A, the first conductive groups CBG1 or the second conductive groups CBG2 may be divided into a connection area AF-CA corresponding to the connection groups and a non-connection area AF-NCA corresponding to the non-connection groups.

After the adhesive member AF is disposed between the electronic component and the substrate SUB (see FIG. 5) of the display panel DP, the driving pad of the electronic component and the signal pad of the substrate SUB may be compressed to the adhesive member AF through an external pressure. In this case, since the adhesive layer AF-BS is compressed by the driving pad and the signal pad, the pattern of the conductive particles CB distributed in the adhesive layer AF-BS may be distorted. For example, the conductive particles CB-C overlapping the connection area AF-CA may move to be adjacent to the non-connection area AF-NCA, or the conductive particles overlapping the non-connection area AF-NCA may move to be adjacent to the connection area AF-CA.

As a result, the conductive particles overlapping one non-connection area AF-NCA may be electrically conducted with the conductive particles overlapping two connection areas AF-CA that face each other with the one non-connection area AF-NCA therebetween. Thus, short circuit between two signal pads or driving pads adjacent to each other may occur.

According to the principles and an exemplary embodiment of the invention, the thickness H1 of the adhesive layer AF-BS in the third direction DR3 may be defined based on a diameter DS of each of the conductive particles CB. For example, the adhesive layer AF-BS may have the thickness H1 of about 0.5 times to about 2.0 times of the diameter DS of each of the conductive particles CB. For example, when the adhesive layer AF-BS is about 1.0 times or less of the diameter DS of each of the conductive particles, at least a portion of the conductive particles may be exposed from the adhesive layer AF-BS. As another example, when the adhesive layer AF-BS is about 1.0 times or more of the diameter DS of each of the conductive particles, the conductive particles may be disposed entirely inside the adhesive layer AF-BS.

Thus, even though the adhesive layer AF-BS having the thickness H1 is compressed by the signal pad and the driving pad, the flow of the conductive particles CB may be reduced. That is, as the thickness of the adhesive layer AF-BS is greater than the uniform thickness of each of the conductive particles, the flow of the conductive particles due to the pressing of the adhesive layer AF-BS may increase. On the other hand, since the thickness of the adhesive layer AF-BS according to the principles pf the invention is set based on the diameter of each of the conductive particles, the flow of the conductive particles may be prevented even though the adhesive layer AF-BS is pressed.

Also, according to an exemplary embodiment, the adhesive layer (AF-BS) may be provided as an adhesive resin including a thermal initiator. That is, the adhesive layer AF-BS may connect the electronic component to the substrate SUB by an external thermal pressure. The adhesive layer AF-BS including the thermal initiator may be activated according to a temperature change caused by heat provided from the outside. Thermal initiators may vary according to a temperature of heat provided during the process of manufacturing the display device DD and the time undertaken to perform a high-temperature process.

Referring to FIG. 6C, the first conductive groups corresponding to two connection areas AF-CA1 and AF-CA2 of the first conductive groups CBG1 and the first conductive groups corresponding to one non-connection area AF-NCA are illustrated.

Hereinafter, in this specification, the first conductive groups overlapping the first connection area AF-CA1 are described as a first sub group CBG1a, and the first conductive groups overlapping the second connection area AF-CA2 are described as a second sub group CBG1b. Also, the first conductive groups overlapping the non-connection area AF-NCA are described as a third sub group CBG1c. Each of the first sub group CBG1a, the second sub group CBG1b, and the third sub group CBG1c includes two conductive groups.

The first sub group CBG1a is disposed between a first signal pad of the signal pads DP-PD disposed on the substrate SUB illustrated in FIG. 5 and a first driving pad DC-PD1a of the first row driving pads DC-PD1 disposed on the driving chip DC. As an example, the conductive particles provided in the first subgroup CBG1a electrically connect a first signal pad of the signal pads DP-PD1 to the first driving pad DC-PD1a.

The second sub group CBG1b is spaced apart from the first sub group CBG1a in the first direction DR1. The second sub group CBG1b is disposed between a second signal pad of the signal pads DP-PD1 disposed on the substrate SUB illustrated in FIG. 5 and a second driving pad DC-PD1b of the first row driving pads DC-PD1. The conductive particles provided in the second sub group CBG1b electrically connect the second signal pad to the second driving pad.

For another example, the first sub group CBG1a may electrically connect the first signal pad to one of the driving pads disposed on the circuit board PB. The second subgroup CBG1b may electrically connect the second signal pad to the other one of the driving pads disposed on the circuit board PB.

The third sub group CBG1c is disposed between the first sub group CBG1a and the second sub group CBG1b to overlap each of the first signal pad and the second signal pad in the plan view.

According to an exemplary embodiment, the conductive groups CBG provided in the adhesive layer AF-BS may be arranged at a predetermined interval (pitch) in the first direction DR1. For example, as illustrated in FIG. 6A, the first conductive groups CBG1 and the second conductive groups CBG2 are arranged at a predetermined interval in the first direction DR1.

In particular, the conductive groups CBG may be spaced a predetermined distance (interval) Dk from each other in the first direction DR1. The predetermined distance Dk may be set based on following Equation (1). Here, Vd is a voltage level applied to the conductive groups CBG, and DSr is insulation strength of the adhesive layer AF-BS.

$$Dk = \frac{Vd}{DSr} \quad (1)$$

That is, when the conductive groups CBG are spaced the predetermined distance Dk from each other, the conductive particles of two conductive groups that are adjacent to each other in the first direction DR1 may be prevented from being electrically conducted with each other. The "predetermined distance" means a distance sufficient to avoid a process error that occurs while the adhesive member AF adheres between the two pads.

Particularly, one of the two conductive groups provided in the third sub group CBG1c (hereinafter, referred to as a 'first conductive group') may be spaced a first distance DSa from the first driving pad DC-PD1a in the plan view. One of the two conductive groups provided in the third sub group CBG1c (hereinafter, referred to as a 'second conductive group') may be spaced a second distance DSb from the second driving pad DC-PD1b in the plan view. Here, each of the first distance DSa and the second distance DSb may be less than the predetermined distance Dk between the two conductive groups.

As a result, the first driving pad DC-PD1a and the first conductive group may be electrically conducted by electric fields between the first driving pad DC-PD1a and the first conductive group. Similarly, the second driving pad DC-PD1b and the second conductive group may be electrically conducted by electric fields between the second driving pad DC-PD1b and the second conductive group.

However, according to an exemplary embodiment, since the first conductive group and the second conductive group of the third sub-group CBG1c are spaced the predetermined distance Dk from each other, the first driving pad DC-PD1a and the second driving pad DC-PD1b may be electrically separated from each other. That is, a short circuit between the first driving pad DC-PD1a and the second driving pad DC-PD1b may be prevented.

As described above, in the process of bonding the chip driving pads DC-PD to the signal pads DP-PD of the driving chip DC through the adhesive member AF according to an exemplary embodiment, the pads may be prevented from being short-circuited therebetween by the conductive particles. Similarly, in the process of bonding the driving pads PB-PD to the connection signal pads DP-CPD of the circuit board PB through the adhesive member AF according to an exemplary embodiment, the pads may be prevented from being short-circuited therebetween by the conductive particles. Therefore, the overall driving reliability of the display device DD may be improved.

Figure 7A:
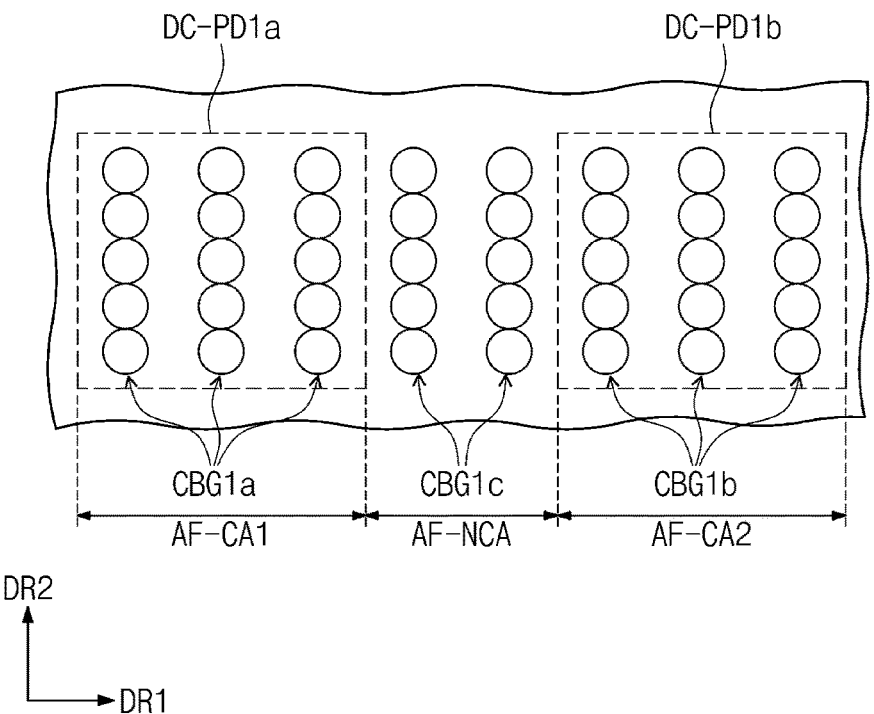
FIG. 7A is a plan view of another exemplary embodiment of the adhesive member of FIG. 6A.
Figure 7B:
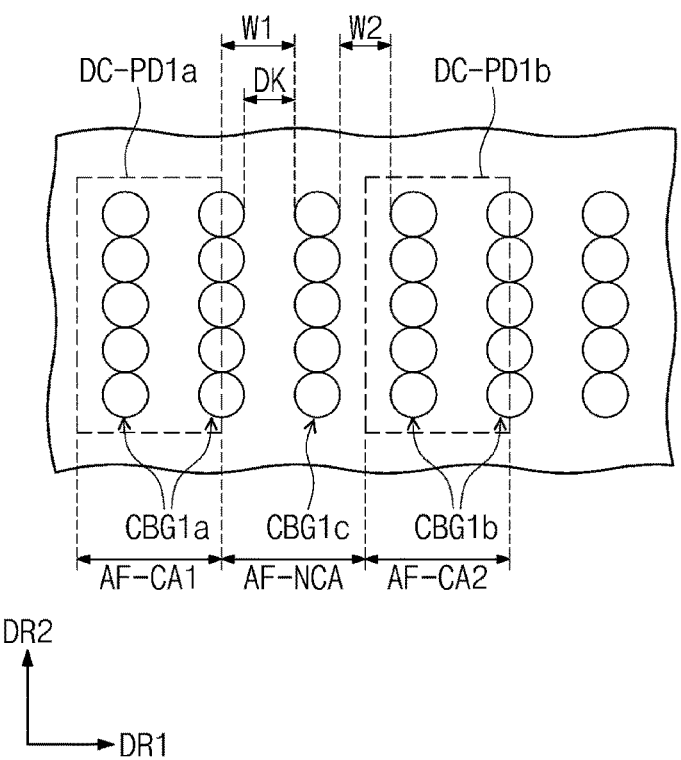
FIG. 7B is a plan view of another exemplary embodiment of the adhesive member of FIG. 6A.
Figure 7C:
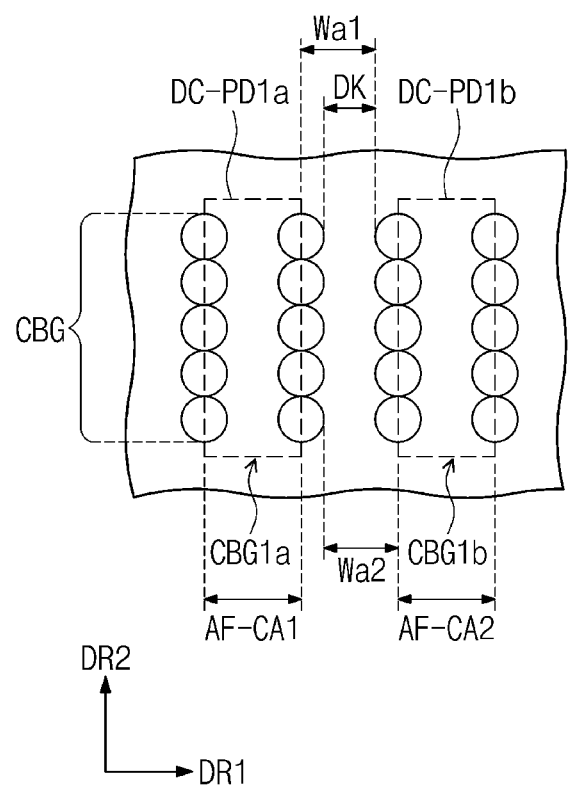
FIG. 7C is a plan view of a further exemplary embodiment of the adhesive member of FIG. 6A.

FIG. 7A is a plan view of another exemplary embodiment of the adhesive member of FIG. 6A. FIG. 7B is a plan view of another exemplary embodiment of the adhesive member according to another embodiment of the inventive concept of FIG. 6A. FIG. 7C is a plan view of a further exemplary embodiment of the adhesive member of FIG. 6A.

Referring to FIG. 7A, the number of conductive groups provided in each of a first sub group CBG1a and a second sub group CBG1b is greater than that of conductive groups provided in a third sub group CBG1c. For example, each of the first sub group CBG1a and the second sub group CBG1b includes three conductive groups, and the third sub group CBG1c includes two conductive groups.

Referring to FIG. 7B, the number of conductive groups provided in each of a first sub group CBG1a and a second sub group CBG1b is greater than that of conductive groups provided in a third sub group CBG1c. For example, each of the first sub group CBG1a and the second sub group CBG1b includes two conductive groups, and the third sub group CBG1c includes one conductive group.

The distance between a first driving pad DC-PD1a and the conductive group of the third group CBG1c in a plan view is defined as a first interval W1. The distance between a second driving pad DC-PD1b and the conductive group of the third group CBG1c is defined as a second interval W2.

According to an exemplary embodiment, the second interval W2 may be less than the first interval W1. That is, the conductive group of the third subgroup CBG1c may be electrically conducted to the second driving pad DC-PD1b by electric fields. However, according to an exemplary embodiment, the conductive group of the third sub group CBG1c and the conductive group that is closer to the third sub group CBG1c of the two conductive groups provided in the first sub group CBG1a are spaced the predetermined distance Dk from each other. As a result, the first driving pad DC-PD1*a* and the second driving pad DC-PD1*b* may be electrically separated from each other.

Referring to FIG. 7C, the conductive groups CBG may be divided into connection areas AF-CA1 and AF-CA2. That is, all the conductive groups CBG may overlap the connection areas.

The first sub group CBG-1 overlaps the first connection area AF-CA1, and the second sub group CBG-2 overlaps the second connection area AF-CA2. The first and second sub groups CBG-1 and CBG-2 may be alternately and repeatedly arranged in the first direction DR1. Each of the first sub group CBG-1 and the second sub group CBG-2 includes at least two conductive groups.

According to an exemplary embodiment, the distance between the first driving pad DC-PD1*a* and the conductive group that is closest to the first sub group CBG-1 of the conductive groups of the second sub group CBG-2 in the plan view is defined as a first interval Wa1. The distance between the second driving pad DC-PD1*b* and the conductive group that is closest to the second sub group CBG-2 of the conductive groups of the first sub group CBG-1 is defined as a second interval Wa2. Particularly, each of the first interval Wa1 and the second interval Wa2 may be greater than the predetermined distance Dk.

That is, the conductive group that is closest to the first sub group CBG-1 and the conductive group that is closest to the second subgroup CBG-2 may be maintained at the predetermined distance DK. As a result, the first driving pad DC-PD1*a* and the second driving pad DC-PD1*b* may be electrically separated from each other.

Figure 8:
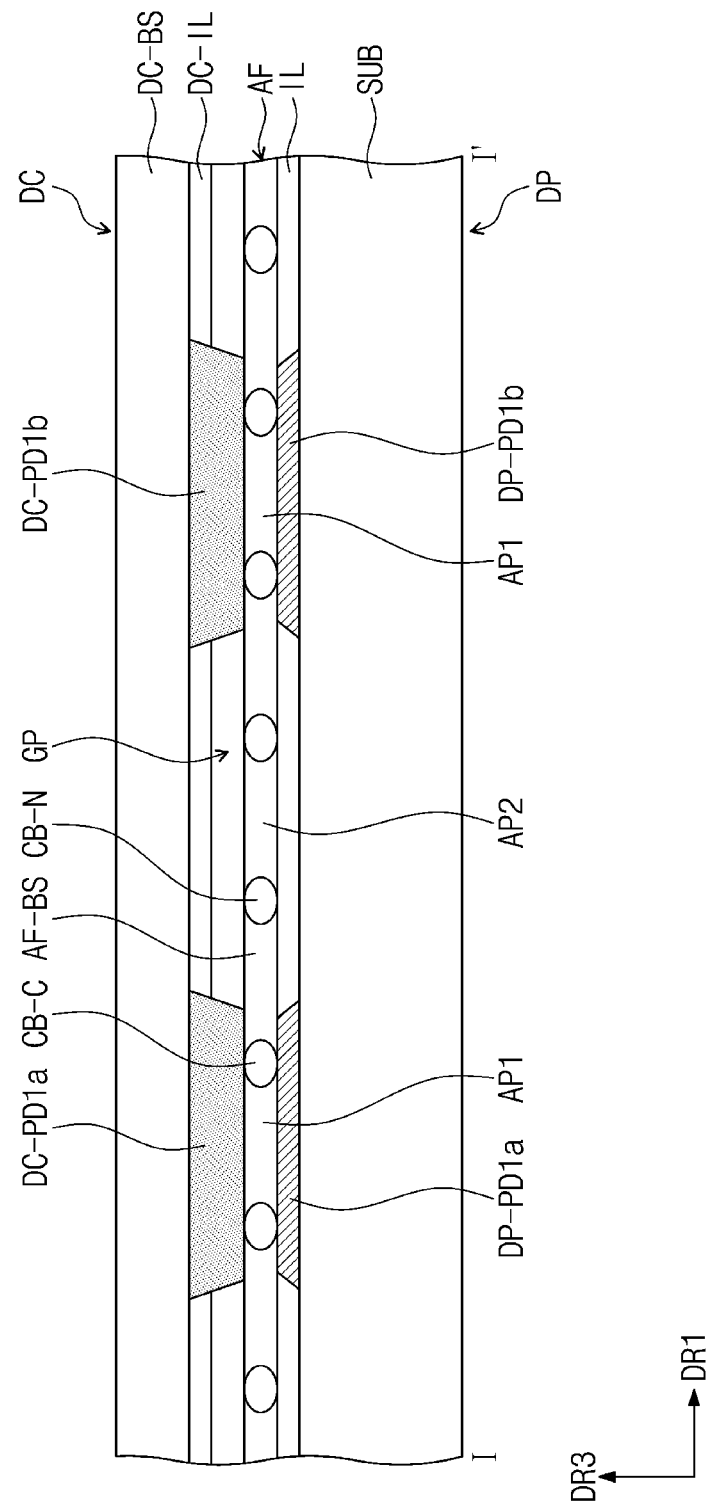
FIG. 8 is a cross-sectional view taken along line I-I' of FIG. 5.
Figure 9:
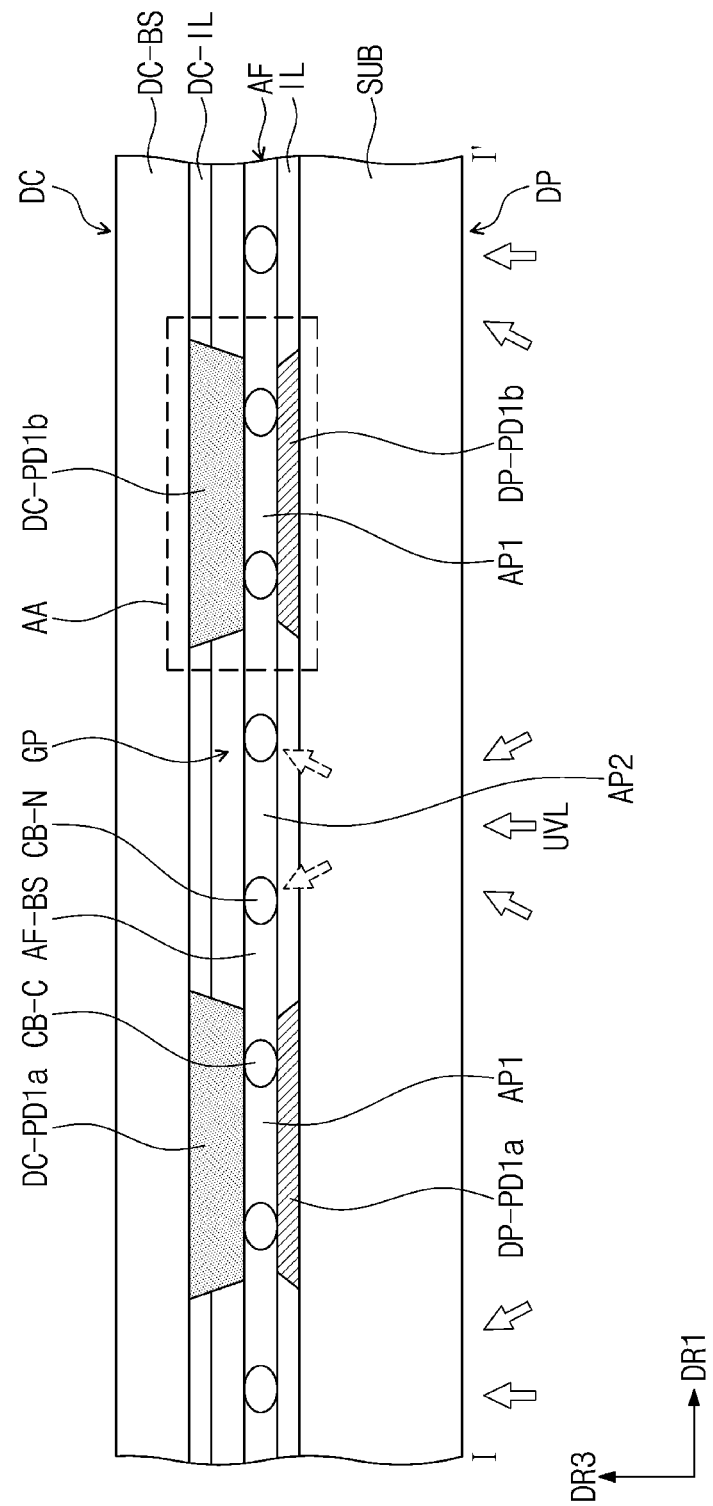
FIG. 9 is a cross-sectional view of another exemplary embodiment of the adhesive member of FIG. 6A.
Figure 10:
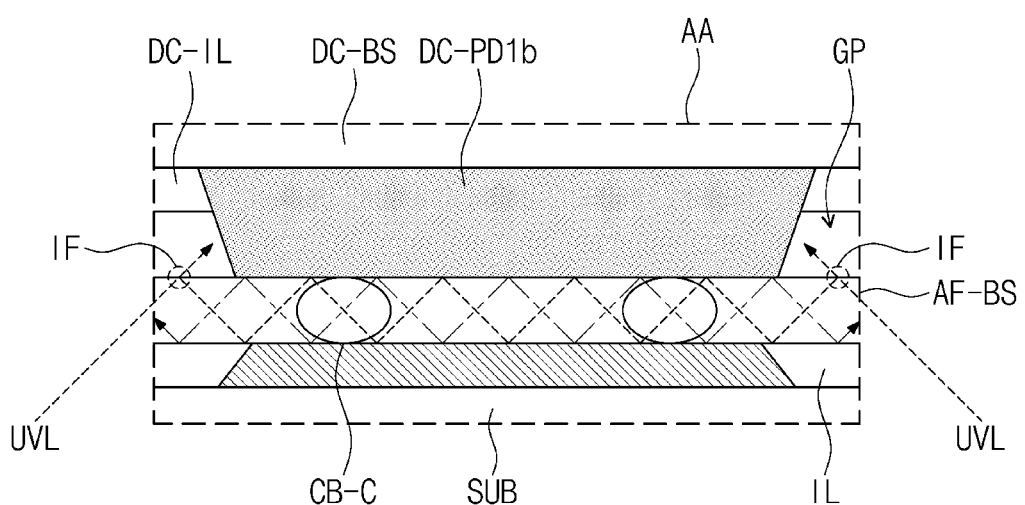
FIG. 10 is an enlarged cross-sectional view of an area AA of FIG. 9.

FIG. 8 is a cross-sectional view taken along line I-I' of FIG. 5. FIG. 9 is a cross-sectional view of another exemplary embodiment of the adhesive member of FIG. 6A. FIG. 10 is an enlarged cross-sectional view of an area AA of FIG. 9.

Referring to FIG. 8, a display panel DP includes a substrate SUB and an insulation layer IL disposed on the substrate SUB. The insulation layer IL may be one of the insulation layers described in FIG. 4B. A first signal pad DP-PD1*a* and a second signal pad DP-PD1*b* may be disposed in a contact hole defined in the insulation layer IL. However, exemplary embodiments are not limited thereto. For example, the insulation layer IL overlapping a driving chip DC may be omitted, and constituents provided in the circuit element layer DP-CL (see FIG. 2) may be additionally provided between the substrate SUB and the insulation layer IL.

The driving chip DC includes a base substrate DC-BS and a pad insulation layer DC-IL disposed on the base substrate DC-BS. A first driving pad DC-PD1*a* and a second driving pad DC-PD1*b* may be disposed in a contact hole defined in a pad insulation layer DC-IL.

Conductive particles CB-C overlapping a connection area AF-CA are disposed between a first signal pad DP-PD1*a* and the first driving pad DC-PD1*a* and between a second signal pad DP-PD1*b* and the second driving pads DC-PD1*b*. Also, conductive particles CB-N overlapping a non-connection area AF-NCA do not overlap the first driving pad DC-PD1*a* and the second driving pad DC-PD1*b* and are disposed the insulation layer IL and the base substrate DC-BS.

Hereinafter, in this specification, an adhesive layer AF-BS is described as including a first adhesive portion AP1 overlapping the connection area AF-CA and a second adhesive portion AP2 overlapping the non-connection area AF-NCA.

According to an exemplary embodiment, the adhesive layer AF-BS may have the thickness of about 0.5 times to about 2.0 times of the diameter DS of each of the conductive particles CB described with reference to FIG. 6C. As a result, the second adhesive portion AP2 may fill only a portion of the space rather than entirely filling the space between the driving chip DC and the substrate SUB. Thus, an inner space GP may be defined between the second adhesive portion AP2 and the base substrate DC-BS. The inner space GP may be filled with air.

Particularly, the height of the inner space GP in the third direction DR3 may be greater than the thickness of the second adhesive portion AP2. Also, as the first adhesive portion AP1 is compressed by the driving pad and the signal pad, at least a portion of the first adhesive portion AP1 may move to the second adhesive portion AP2. As a result, the thickness of the second adhesive portion AP2 may be at least partially greater than that of the first adhesive portion AP1. This may correspond to a case in which the thickness of the adhesive layer AF-BS is greater about 1.1 times than the diameter DS of each of the conductive particles CB. For another example, when the thickness of the adhesive layer AF-BS is less about 1.0 times than the diameter DS of each of the conductive particles CB, the thicknesses of the first adhesive portion AP1 and the second adhesive portion AP2 may be substantially the same.

According to an exemplary embodiment of the invention, the adhesive layer AF-BS may be an adhesive resin including a photo initiator. The adhesive layer AF-BS including the photo initiator may be activated by ultraviolet rays. Particularly, the adhesive layer AF-BS may have a refractive index greater than about 1.0, which is a refractive index of the air. For example, the adhesive layer AF-BS may have a refractive index of about 1.3 to about 2.5.

As the adhesive layer AF-BS is provided as the adhesive resin including the photo initiator, after the adhesive member AF is disposed on the driving chip DC and the substrate SUB, external ultraviolet rays UVL are emitted to the adhesive layer AF-BS.

In this case, since each of the driving pads provided in the driving chip DC and the pads disposed on the substrate SUB are made of a metal material, the external ultraviolet rays may not be transmitted therethrough. Thus, hardening of the first adhesive portion AP1 disposed between the driving pad and the signal pad, which face each other, may be difficult.

According to an exemplary embodiment, the refractive index of the second adhesive portion AP2 and the refractive index of the air constituting the inner space GP may be different from each other. As a result, the ultraviolet rays may be totally reflected on an interface between the adhesive portion and the inner space GP. That is, the hardening of the first adhesive portion AP1 may be performed through the total reflection of the ultraviolet rays emitted onto the second adhesive portion AP2.

In detail, referring to FIGS. 9 and 10, the external ultraviolet light UVL may be emitted to the second adhesive portion AP2 at an angle inclined to the third direction DR3. Thus, the ultraviolet light UVL may be totally reflected by a difference in refractive index on the interface IF between the second adhesive portion AP2 and the inner space GP.

That is, as illustrated in FIG. 10, a portion of the ultraviolet light UVL emitted to the second adhesive portion AP2 may be emitted onto the inner space GP, and the other portion may be totally reflected to be emitted to the first adhesive portion AP1. As a result, the hardening of the first adhesive portion AP1 may be performed more efficiently.

Figure 11:
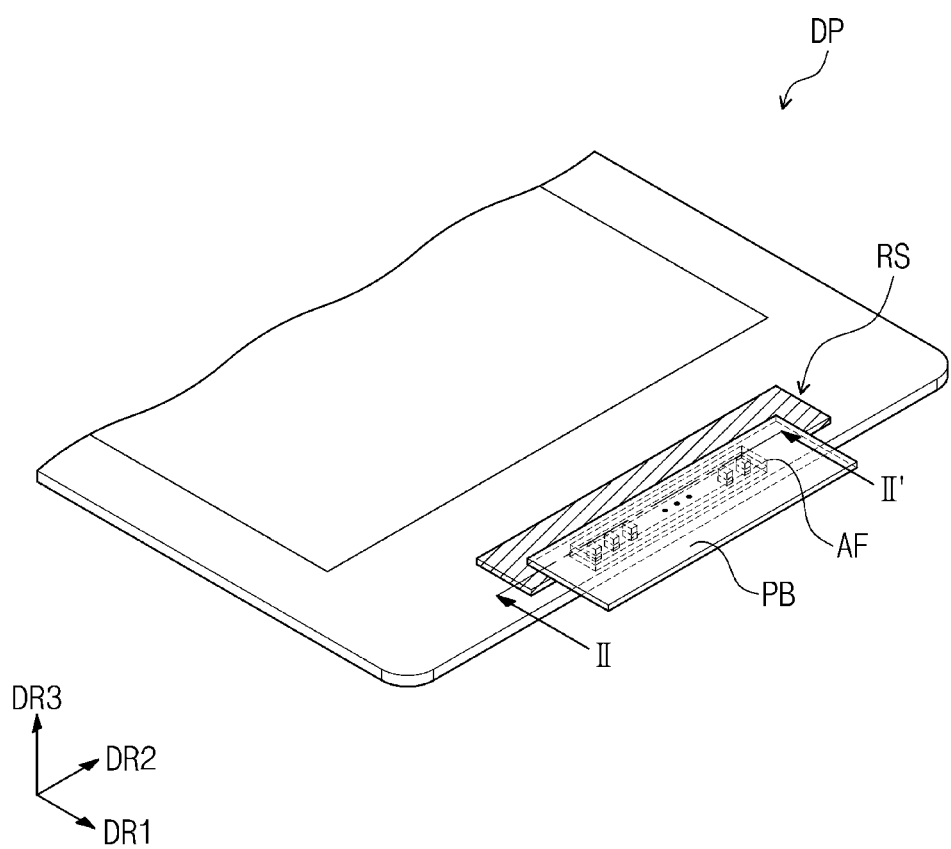
FIG. 11 is a perspective view of another exemplary embodiment of a display device constructed according to principles of the invention.
Figure 12:
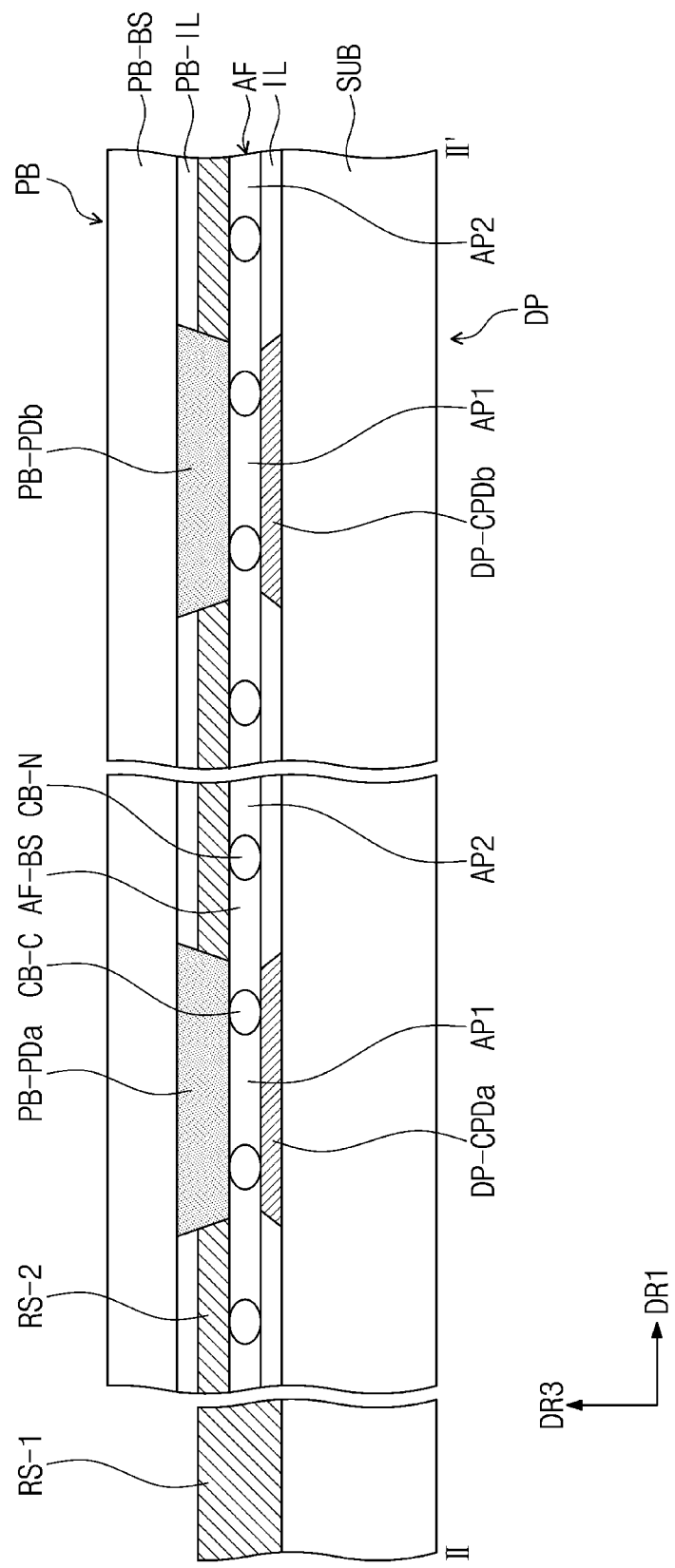
FIG. 12 is a cross-sectional view taken along line II-II' of FIG. 11.

FIG. 11 is a perspective view of another exemplary embodiment of the display device constructed according to principles of the invention. FIG. 12 is a cross-sectional view taken along line II-II' of FIG. 11.

Referring to FIG. 11, a display panel DP may further include a filler RS filled in the inner space GP illustrated in FIG. 10.

The filler RS may include a photo initiator. The fillers RS including the photo initiator may be activated by external ultraviolet rays. FIG. 11 illustrates a circuit board PB as an electronic component. The filler RS connects the circuit board PB to a substrate SUB. The filler RS may overlap the circuit board PB in a plan view.

Referring to FIG. 12, the filler RS includes a first filling portion RS-1 that does not overlap the electronic component and is disposed on the substrate SUB and a second filling portion RS-2 that is disposed between the electronic component and the substrate SUB.

According to an exemplary embodiment, the circuit board PB includes a base circuit board PB-BS and a circuit insulation layer PB-IL. However, the structure of the circuit board PB is not limited thereto and may be variously modified. A first driving pad PB-PDa and a second driving pad PB-PDb of the circuit board PB-BS face a first connection signal pad DP-CPDa and a second connection signal pad DP-CPDb, respectively.

Particularly, an inner space is defined between a second adhesive portion AP2 of an adhesive member AF that does not overlap the first driving pad PB-PDa and the second driving pad PB-PDb and the base circuit board PB-BS. According to an exemplary embodiment, a process of filling the second filling portion RS-2 in the inner space is as follows.

First, the filler RS may be disposed on the substrate SUB so as not to overlap the circuit board PB. In this case, the filler RS before emitting the ultraviolet rays may be provided as a filler RS having a liquid property. As a result, a portion of the fillers RS disposed on the substrate SUB may be permeated into the inner space between the circuit board PB and the substrate SUB. Thereafter, as the external ultraviolet rays are emitted to the inner space, the inner space may be filled with the filler RS.

According to an exemplary embodiment, a planar area of the first filling portion RS-1 may be greater than that of the second filling portion RS-2. Also, the thickness of the first filling portion RS-1 may be greater than that of the second filling portion RS-2 in a third direction DR3.

According to the principles and exemplary implementations of the invention, the thickness of the adhesion layer may be formed based on the diameter of the conductive particle. As a result, even though the pressure is applied to the adhesion layer from the outside while the two pads are bonded to each other, the flow of the conductive particles distributed in the adhesion layer may be prevented. The flow of the conductive particles may be prevented, which in turn, minimizes short-circuiting of adjacent pads. Therefore, the overall driving reliability of the display device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first layer having a display area and a non-display area adjacent thereto, the first layer including first and second pads overlapping the non-display area and spaced apart from each other in a first direction;
   a second layer including third and fourth pads that respectively face the first and second pads in a thickness direction of the first layer; and
   an adhesive layer disposed between the first and second layers and including and a plurality of conductive groups spaced apart from each other in the first direction and distributed along a second direction generally perpendicular to the first direction,
   wherein the conductive groups comprise conductive particles arranged in the second direction, and the adhesive layer has a thickness greater than about 0.5 times to about 2.0 times a diameter of the conductive particles.

2. The display device of claim 1, wherein the conductive groups are arranged at a predetermined interval in the first direction.

3. The display device of claim 1, wherein the conductive groups comprise three sub groups, and the first and second pads comprise, respectively, first and second signal pads and the third and fourth pads comprise, respectively, first and second driving pads; and
   the first sub group is disposed between the first signal pad and the first driving pad to electrically connect the first signal pad to the first driving pad,
   the second sub group is disposed between the second signal pad and the second driving pad to electrically connect the second signal pad to the second driving pad, and
   the third sub group is disposed between the first sub group and the second sub group without overlapping either of the first signal pad and the second signal pad.

4. The display device of claim 3, wherein each of the first sub group, the second sub group, and third sub group comprises at least one conductive group of the conductive groups.

5. The display device of claim 4, wherein each of the first sub group, the second sub group, and third sub group comprises corresponding conductive groups of the conductive groups, wherein the number of conductive groups of each of the first sub group and the second sub group is greater than that of conductive groups of the third sub group.

6. The display device of claim 4, wherein each of the first sub group and the second sub group comprises corresponding conductive groups and the third sub group comprises two conductive groups,
   a first distance between the first driving pad and a first conductive group that is closest to the first driving pad is greater than a second distance between the second driving pad and a second conductive group that is closest to the second driving pad in a plan view, and
   a distance between the first conductive group and the second conductive group that is closest to the first conductive group among the conductive groups of the third sub group is greater than each of the first distance and the second distance.

7. The display device of claim 1, wherein the first layer comprises a display substrate, the second layer comprises an electronic component, the first and second pads comprise, respectively, first and second signal pads, and the third and fourth pads comprise, respectively, first and second driving pads, and the conductive groups comprise a first sub group disposed between the first signal pad and the first driving pad and a second sub group disposed between the second signal pad and the second driving pad, and the first sub group and the second sub group are alternately and repeatedly arranged in the first direction.

8. The display device of claim 7, wherein the conductive groups are arranged at a predetermined interval in the first direction, and each of a first distance between the first driving pad and a conductive group that is closest to the first sub group among the conductive groups of the second sub group and a distance between the second driving pad and a conductive group that is closest to the second sub group among the conductive groups of the first sub group is greater than the predetermined interval in a plan view, wherein the predetermined interval satisfies following equation:

$$Dk = \frac{Vd}{DSr}$$

where Dk is a spaced distance, Vd is a voltage level applied to each of the conductive particles, and DSr is an insulation strength of the adhesive layer.

9. The display device of claim 1, wherein the second layer comprises an electronic component, and the electronic component further comprises a base substrate on which the first driving pad and the second driving pad are disposed, the adhesive layer comprises a first adhesive portion overlapping the first driving pad and the second driving pad and a second adhesive portion that does not overlap the first driving pad and the second driving pad, and further comprising an inner space defined between the second adhesive portion and the base substrate.

10. The display device of claim 9, wherein the second adhesive portion partially fills the inner space.

11. The display device of claim 9, wherein the adhesive layer has a refractive index greater than that of air within the inner space.

12. The display device of claim 9, wherein the adhesive layer comprises a photo initiator activated by external ultraviolet rays.

13. The display device of claim 9, further comprising a filler having a first filling portion that does not overlap the electronic component and a second filling portion disposed in the inner space.

14. The display device of claim 13, wherein the filler comprises a photo initiator activated by external ultraviolet rays.

15. The display device of claim 13, wherein the first filling portion has a planar area greater than that of the second filling portion.

16. The display device of claim 1, wherein the adhesive layer comprises a thermal initiator activated by a temperature change.

17. The display device of claim 1, wherein a spaced distance between two adjacent conductive groups of the conductive groups satisfies following equation:

$$Dk = \frac{Vd}{DSr}$$

where Dk is a spaced distance, Vd is a voltage level applied to each of the conductive particles, and DSr is an insulation strength of the adhesive layer.

18. An adhesive member for connecting electronic components in a display device, the adhesive member comprising:

an adhesive layer; and conductive groups distributed on the adhesive layer at a predetermined interval in a first direction and extending in a second direction generally perpendicular to the first direction, wherein the conductive groups comprise conductive particles arranged in the second direction, and the adhesive layer has a thickness greater than about 0.5 times to about 2.0 times a diameter of the conductive particles.

19. The adhesive member of claim 18, wherein at least some of the conductive particles are partially exposed by the adhesive layer.

20. The adhesive member of claim 18, wherein at least some of the conductive particles arranged in the second direction are electrically connected to each other.

* * * * *